United States Patent [19]

Takano

[11] Patent Number: 5,966,332
[45] Date of Patent: *Oct. 12, 1999

[54] FLOATING GATE MEMORY CELL ARRAY ALLOWING CELL-BY-CELL ERASURE

[75] Inventor: Yoh Takano, Gifu-ken, Japan

[73] Assignee: Sanyo Electric Co., Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/774,255

[22] Filed: Nov. 27, 1996

[30] Foreign Application Priority Data

Nov. 29, 1995 [JP] Japan ................................. 7-311101

[51] Int. Cl.$^6$ .................................................. G11C 11/34
[52] U.S. Cl. ............................. 365/185.29; 365/185.28
[58] Field of Search ........................ 365/185.14, 185.18, 365/185.29, 185.21, 185.22, 185.03, 185.28

[56] References Cited

U.S. PATENT DOCUMENTS

| | | | |
|---|---|---|---|
| 4,698,787 | 10/1987 | Mukherjee | 365/185 |
| 5,202,850 | 4/1993 | Jenq | 365/185 |
| 5,491,656 | 2/1996 | Sawada | 365/185.29 |
| 5,557,572 | 9/1996 | Sawada | 365/185.29 |
| 5,583,812 | 12/1996 | Harari | 365/185.03 |
| 5,598,369 | 1/1997 | Chen | 365/185.18 |
| 5,644,532 | 7/1997 | Chang | 365/185.16 |

OTHER PUBLICATIONS

The Institute of Electronics, Information and Communication Engineers, "A Bit Erasable Flash EEPROM Technology with a Single Floating Gate Transistor Memory Cell" Technical Report of IEICE, SDM93–23, (1993–05), pp. 9–14.

*Primary Examiner*—A. Zarabian
*Attorney, Agent, or Firm*—Sheridan Ross P.C.

[57] ABSTRACT

A non-volatile semiconductor memory device includes a plurality of memory cells. Each of the plurality of memory cells has a control gate, a source, a drain and a floating gate for storing charges. The floating gate is preferably capacitively coupled to at least one of the source and the drain. The memory device also includes a control circuit for controlling voltages that are respectively applied to the control gate, the source and the drain in order to execute an erasure operation of at least one memory cell in a "memory cell-by-memory cell" format.

25 Claims, 24 Drawing Sheets word line erase mode write mode read mode standby mode bit erase mode

| previous data | write data | bit-line voltage |
|---|---|---|
| 1 | 0 | +12V |
| 0 | 1 | 0V |
| 1 | 1 | +5V |
| 0 | 0 | +5V |

Fig.12

| write data | mask data | bit-line voltage |
|---|---|---|
| 0 | 0 | +12V |
| 1 | 0 | 0V |
| 0 | 1 | +5V |
| 1 | 1 | +5V |

Fig.16 bit erase mode

| write data | mask data | bit-line voltage |
|---|---|---|
| 0 | 0 | +5V |
| 1 | 0 | 0V |
| 0 | 1 | +5V |
| 1 | 1 | +5V |

Fig.17 write mode

| write data | mask data | bit-line voltage |
|---|---|---|
| 0 | 0 | +12V |
| 1 | 0 | 0V |
| 0 | 1 | 0V |
| 1 | 1 | 0V |

Fig.23

| a1 | a2 | a3 | DATA1 | DATA2 |
|----|----|----|-------|-------|
| 1  | 1  | 1  | 0     | 0     |
| 0  | 1  | 1  | 0     | 1     |
| 0  | 0  | 1  | 1     | 0     |
| 0  | 0  | 0  | 1     | 1     |

Fig.26

| | data comparison | internal write data | bit-line voltage |
|---|---|---|---|
| erasure | read data<write data | 1 (erasure) | 0V |
| erasure | read data≥write data | 0 (held) | +5V |
| writing | read data>write data | 1 (write) | +12V |
| writing | read data≤write data | 0 (held) | 0V |

FLOATING GATE MEMORY CELL ARRAY ALLOWING CELL-BY-CELL ERASURE

BACKGROUND OF THE INVENTION

1. Field of the Invention

The present invention relates to a non-volatile semiconductor memory device, and, more particularly, to a non-volatile semiconductor memory device capable of selectively erasing data in a "memory cell-by-memory cell" basis.

2. Description of the Related Art

Great attention has been paid to non-volatile semiconductor memories, such as a FRAM (Ferro-electric Random Access Memory), EPROM (Erasable and Programmable Read Only Memory) and EEPROM (Electrically Erasable and Programmable Read Only Memory). The EPROM and EEPROM have a plurality of memory cells each including a floating gate for storing charges and a control gate for detecting a change in the threshold voltage in accordance with the quantity of charges stored in the floating gate. Therefore, data is stored using these types of memory cells. The EEPROM can erase data of the entire array of memory cells. The EEPROM includes a flash EEPROM which has the memory cell array separated to a plurality of blocks and can thus selectively erase data block by block. The flash EEPROM has the following advantages:

(1) Non-volatile property for stored data, (2) Low consumed power, (3) Electrically rewritable (rewritable on board), and (4) Low cost.

Therefore, this flash EEPROM is widely applicable as a memory for storing programs or data in electronic devices, such as a portable telephone and a portable information terminal. There are two types of flash EEPROMs at present: split gate type and a stacked gate type.

U.S. Pat. No. 5,202,850 discloses a split gate flash EEPROM. As shown in FIG. 1, a split gate memory cell 201 has an N type source S and N type drain D, both defined on a P type single crystalline silicon substrate 102, a floating gate FG provided on a channel CH between the source S and drain D via a first insulator film 103, and a control gate CG located on the floating gate FG via a second insulator film 104. A part of the control gate CG is arranged as a select gate 105 on the channel CH via the first insulator film 103.

As shown in FIG. 2, a memory cell array 222 of the flash EEPROM has a matrix of split gate memory cells 201, a plurality of word lines WLa to WLz each commonly connected to the control gates CG of an associated row of memory cells 201, a plurality of bit lines BLa to BLz each commonly connected to the drains D of an associated column of memory cells 201, and a common source line SL connected to the sources S of all the memory cells 201. The word lines WL–WLz are connected to a row decoder 223, and the bit lines BLa–BLz are connected to a column decoder 224.

In a word line erase mode of the flash EEPROM, as shown in FIG. 3, a voltage of a ground level (=0 V) is applied to all the bit lines BLa–BLz and the common source line SL. A voltage of +15 V is applied to a selected word line WLm and the voltage of the ground level is applied to the other, non-selected word lines WLa–WL1 and WLn–WLz. As a result, the potentials of the control gates CG of the memory cells 201a and 201b which are connected to the selected word line WLm are raised to +15 V.

When the potential of the control gate CG is +15 V and that of the drain D is 0 V, a relatively high electric field is produced between the control gate CG and the floating gate FG because the electrostatic capacitance between the floating gate FG and the drain D is significantly greater than that between the control gate CG and the floating gate FG. Consequently, a Fowler-Nordheim (FN) tunnel current flows to the floating gate FG from the control gate CG so that electrons in the floating gate FG are drained into the control gate CG. Accordingly, data stored in the memory cells 201a and 201b are erased. That is, erasure is performed to all the memory cells 201 that are connected to a selected one of the word lines WL–WLz. If a plurality of word lines among the entire word lines WL–WLz are selected at a time, data can be erased from all the memory cells 201 connected to the selected word lines. This erasure is called block erasure.

In the above word line erase mode, data is erased from all the memory cells 201 that are connected to any selected word line or word lines WL–WLz. In other words, erasure is executed word line by word line. Unfortunately, such erasure operation cannot be carried out to erase data of a single memory cell 201. Data erasure from a single memory cell alone may be accomplished as follows.

First, data is erased from all the memory cells that are associated with a word line to which an arbitrary memory cell to be erased is connected. Then, the data present before erasure is rewritten in the memory cells other than the arbitrary memory cell. In this manner, an arbitrary memory cell may be erased.

Disadvantageously, the execution of erasing and rewriting operations on the memory cells located on the wordline having the arbitrary memory cell, reduces the durability of the memory cells which did not require erasure in the first place. In fact, the number of data rewritings that may be performed on memory cells of a flash EEPROM is limited. This is because electrons that are injected into, or drained from the floating gates FG during erasing and rewriting operations must pass through the first and second insulator films 103 and 104. As is well known in the art, passing electrons in erase mode deteriorates the second insulator film 104, and passing electrons in write mode deteriorates the first insulator film 103. The degradation of the insulator films 103 and 104 unfortunately causes erasure and writing failures that hinder efficient data storage.

Further, repeated data erasures on memory cells that require no erasure increases power consumption and reduce operational speeds of a flash EEPROM. The above-described scheme of erasing data from a single memory cell therefore complicates control operations by memory controllers, i.e., increases the circuit area, and increases the burden on the controller. Consequently, these disadvantages reduce critical operational speeds of flash EEPROMs.

Yasuo Sato et al have disclosed the scheme that enables one bit erasure from a stacked gate flash EEPROM using one-transistor type memory cells (Singaku Technical Report, SDM93-23 CD93-25 (1993-05), pp. 9–14). The method in this paper performs data writing by using the FN tunnel current which flows to the floating gate from the drain. In the word line erasure (which is called "sector erasure" in this paper), the FN tunnel current which flows to the entire channel from the floating gate is used. In the one-bit erasure, the injecting of hot electrons into the floating gate from the channel are utilized.

This method however involves different erasing schemes for the word line erasure and the bit erasure, which complicates the whole circuit of the flash EEPROM. Furthermore, the stacked gate memory cells have a low efficiency in injecting hot electrons to the floating gate from the channel. This reduces the number of memory cells that may be simultaneously erased in a one-bit erase mode. When the FN tunnel current which flows to the floating gate from the drain is used in the write mode, a DINOR type or AND type memory cell structure should be employed to prevent disturbance. That is, a simple NOR type memory cell structure cannot be used.

SUMMARY OF THE INVENTION

Broadly speaking, the present invention relates to a non-volatile semiconductor memory device having excellent durability, low power consumption and substantially improved operational speeds. It should be appreciated that the present invention can be implemented in numerous forms including an apparatus and a method.

In one embodiment of the present invention, a non-volatile semiconductor memory device including a plurality of memory cells is disclosed. Each of the plurality of memory cells has a control gate, a source, a drain and a floating gate for storing charges. The floating gate is preferably capacitively coupled to one of the source and the drain. The non-volatile semiconductor memory device further includes a control circuit for controlling voltages that are respectively applied to the control gate, the source and the drain in order to execute an erasure operation of at least one memory cell in a "memory cell-by-memory cell" format. Advantageously, this embodiment provides a non-volatile semiconductor memory device without having to unnecessarily enlarge the circuit scale.

In another embodiment of the present invention, a non-volatile semiconductor memory device including a plurality of word lines, and a plurality of bit lines is disclosed. The non-volatile semiconductor memory device also includes a plurality of memory cells that are selectable by the plurality of word lines and the plurality of bit lines. Each memory cell has a control gate connected to an associated one of the plurality of word lines, a drain connected to an associated one of the plurality of bit lines, a source, and a floating gate. The floating gate is preferably capacitively coupled to the control gate and the drain. The non-volatile semiconductor memory device further includes a control circuit for controlling voltages that are respectively applied to the word lines, the bit lines and the sources in a "memory cell-by-memory cell" manner in order to execute erasure of at least one memory cell. In this embodiment, when at least one memory cell selected for erasure is included in a group of memory cells associated with one of the plurality of word lines, the control circuit applies a sufficient voltage for suppression of flow of a Fowler-Nordheim tunnel current between the floating gates and the control gates to bit lines connected to the drains of memory cells in the group of memory cells excluding the selected at least one memory cell.

In yet another embodiment of the present invention, a non-volatile semiconductor memory device including a plurality of word lines, and a plurality of bit lines is disclosed. The non-volatile semiconductor memory device also includes a plurality of memory cells selectable by the plurality of word lines and the plurality of bit lines, and each having a control gate connected to an associated one of the plurality of word lines, a drain connected to an associated one of the plurality of bit lines, a source, a channel defined between the drain and the source, and a floating gate. The floating gate is preferably capacitively coupled to the control gate and the drain. Further, a control circuit for controlling voltages that are respectively applied to the word lines, the bit lines and the sources is included within the non-volatile semiconductor memory device. In this embodiment, the voltages are applied in a "memory cell-by-memory cell" manner to execute erasure of at least one memory cell and execute writing of another at least one memory cell at about a same time. Further, when at least two memory cells selected for erasure and writing are included in a group of memory cells associated with one of the plurality of word lines, the control circuit applies a sufficient voltage for generating a relatively high electric field between the floating gates and control gates to a bit line connected to the drain of the at least one memory cell selected for writing. In this manner, hot electrons are injected into the floating gates from the channels.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 4 to 7B illustrate a first embodiment of the invention in which:

FIG. 4 is a cross-sectional view of a split gate non-volatile semiconductor memory cell;

FIG. 5 is a block diagram showing a non-volatile semiconductor memory device;

FIGS. 7A and 7B are circuit diagrams showing a part of the memory cell array used for explaining a standby mode and a bit erase mode, respectively.

FIGS. 8 through 12 illustrate a second embodiment of the invention in which:

FIG. 8 is a circuit diagram showing part of the memory cell array used for explaining the operation of a bit erase mode;

FIG. 9 is a diagram for explaining the bit-line voltage that is determined by previous data already stored in a memory cell and write data to be newly written;

FIG. 10 is a block diagram showing a non-volatile semiconductor memory device;

FIG. 11 is a flowchart for explaining the operations of the memory device in a write mode and bit erase mode; and FIG. 12 is a diagram for explaining the bit-line voltage that is determined by comparison of write data with mask data in the verification after writing and erasure.

FIGS. 13 through 17 illustrate a third embodiment of the invention in which:

FIG. 13 is a block diagram illustrating a non-volatile semiconductor memory device;

FIG. 14 is a circuit diagram showing a part of a memory cell array used for explaining the operation in a bit erase mode;

FIG. 15 is a flowchart explaining the operations of the memory device in a write mode and bit erase mode;

FIG. 16 is a diagram used for explaining the bit-line voltage that is determined by comparison of write data with mask data in the verification after erasure; and FIG. 17 is a diagram used for explaining the bit-line voltage that is determined by comparison of write data with mask data in the verification after writing.

FIGS. 21 through 26 illustrate a sixth embodiment of the invention in which:

FIG. 21 is a characteristic graph showing the relationship between the quantity of charges in the floating gate of a memory cell and the read (cell) current that flows through the memory cell;

FIG. 22 is a circuit diagram showing one of a plurality sense amplifiers in a non-volatile semiconductor memory device;

FIG. 23 is a diagram used for explaining 4-value data that is read by the sense amplifier in FIG. 22;

FIG. 24 is a block diagram of the non-volatile semiconductor memory device;

FIG. 25 is a flowchart explaining the operations of the memory device in a write mode and bit erase mode; and FIG. 26 is a diagram used for explaining the bit-line voltage that is determined by internal write data based on the comparison of the read data with write data.

DETAILED DESCRIPTION OF THE PREFERRED EMBODIMENTS

First Embodiment

A non-volatile semiconductor memory device according to the first embodiment of the present invention will now be described with reference to the accompanying drawings. In this embodiment, the invention is directed at a split gate flash EEPROM as shown in FIG. 5.

Figure 1:
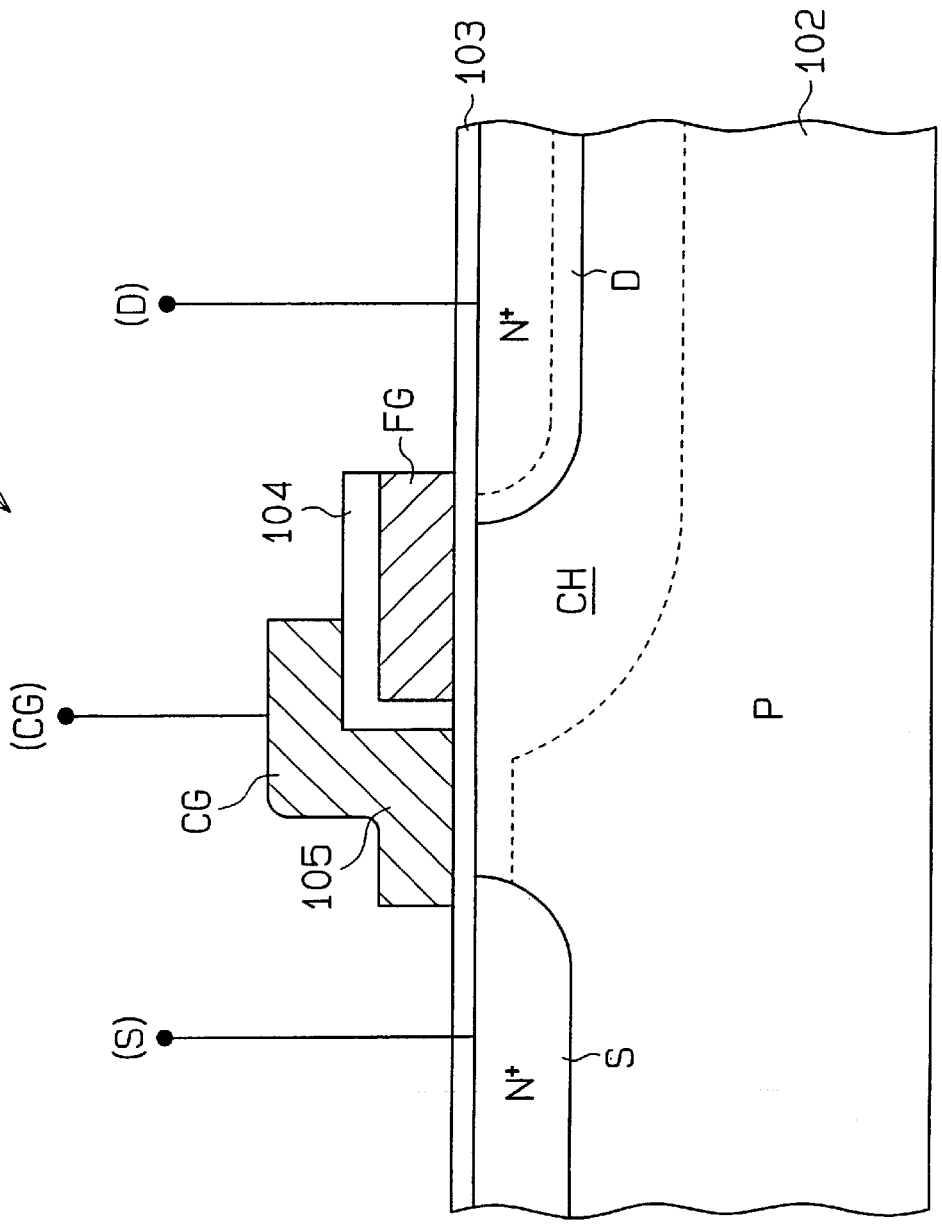
FIG. 1 is a cross-sectional view of a conventional split gate non-volatile semiconductor memory device.
Figure 2:
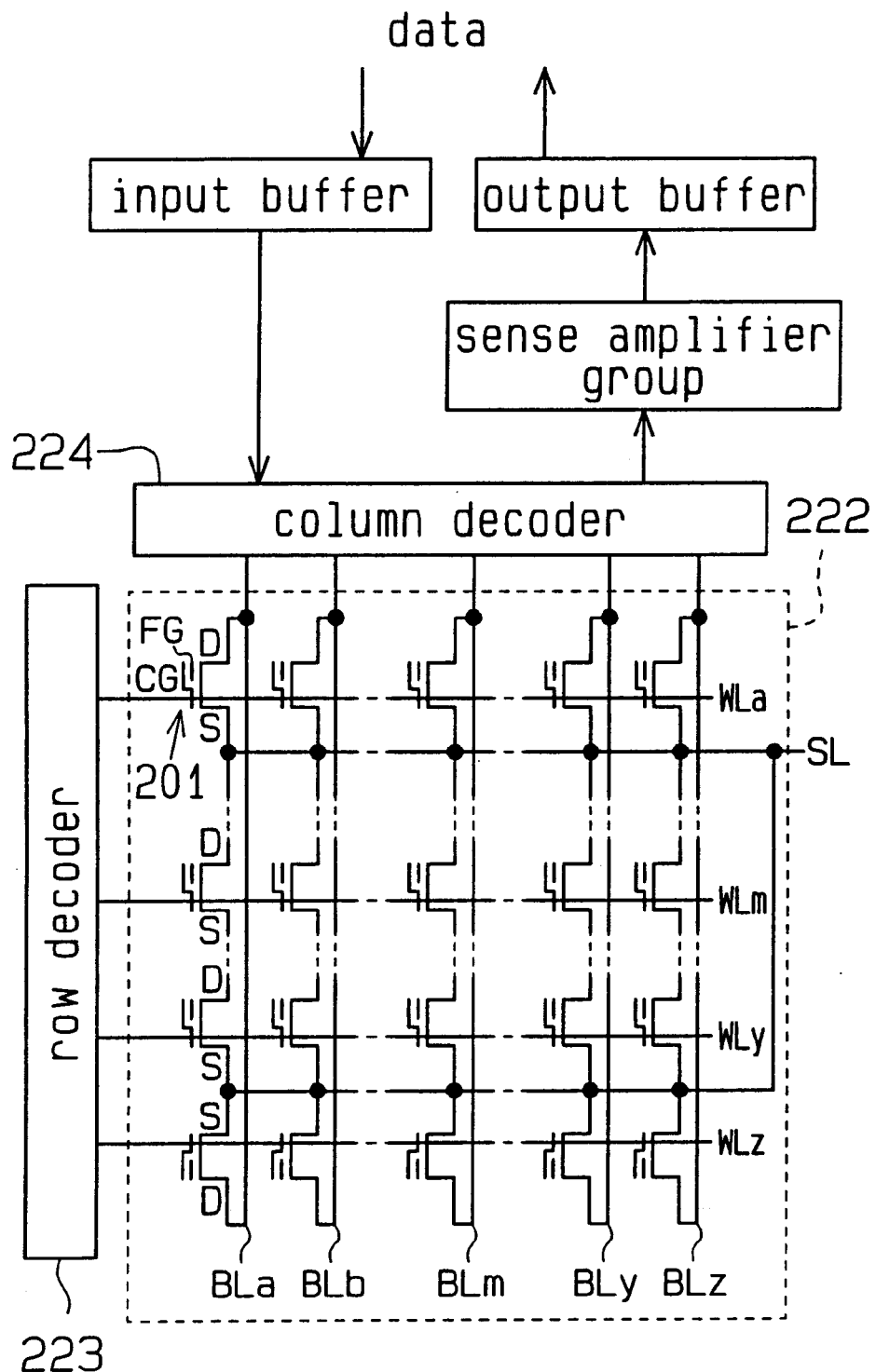
FIG. 2 is a block circuit diagram showing a memory device having a memory cell array according to the prior art.
Figure 3:
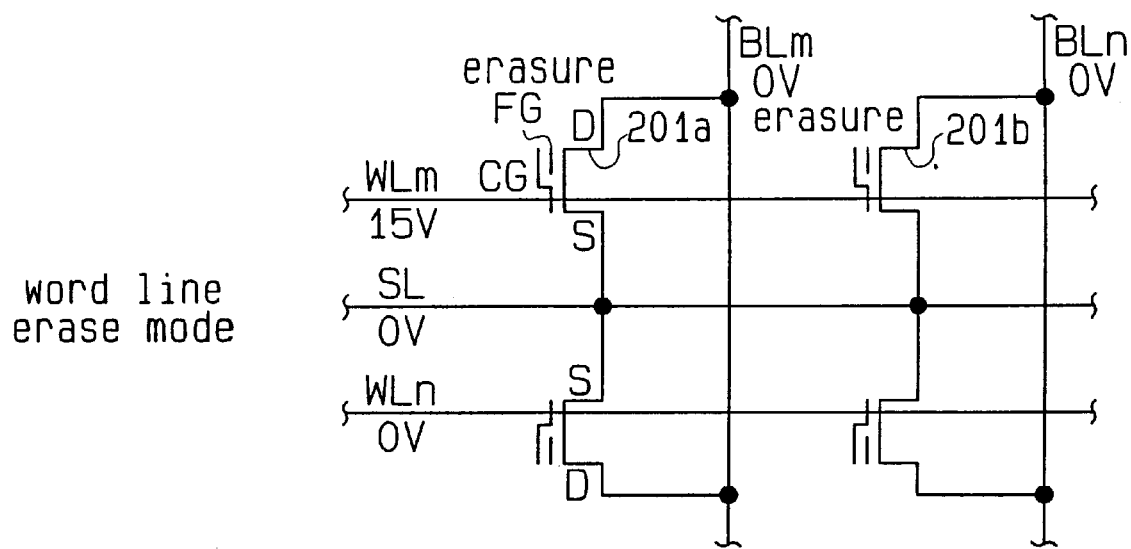
FIG. 3 is a circuit diagram showing part of the memory cell array of FIG. 2 for explaining the operation of a word line erase mode according to the prior art.
Figure 4:
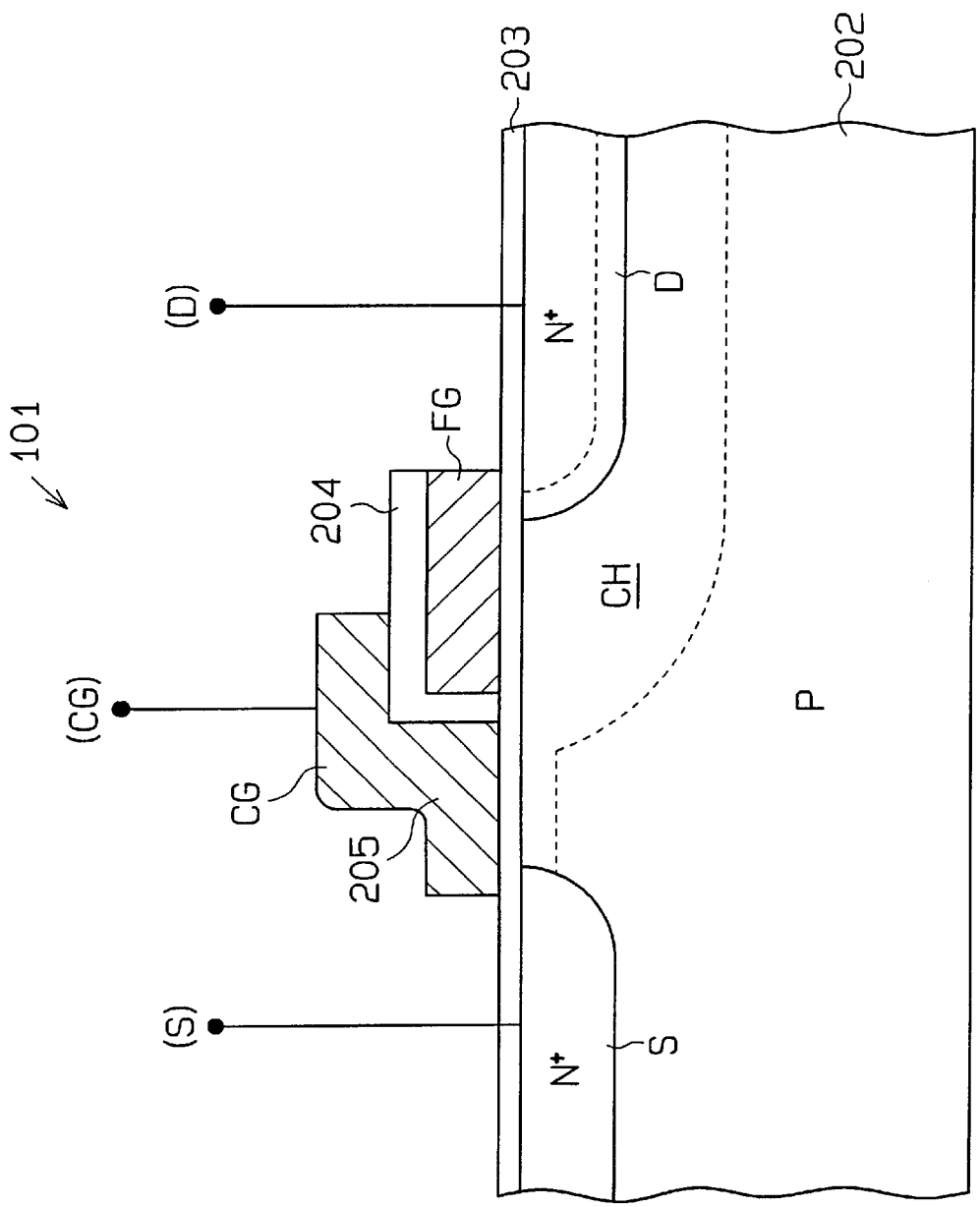

As shown in FIG. 4, a split gate memory cell 101 has a source S of an N type conductivity and a drain D of an N type conductivity, both defined on a single crystalline silicon substrate 202 having a P type conductivity, a floating gate FG provided on a channel CH between the source S and drain D via a first insulator film 203, and a control gate CG provided on the floating gate FG via a second insulator film 204. A part of the control gate CG is arranged as a select gate 205 on the channel CH via the first insulator film 203, and the remaining part is arranged on the floating gate FG via the second insulator film 204. The floating gate FG, which stores charges, is capacitively coupled to the drain D and the control gate CG.

Figure 5:
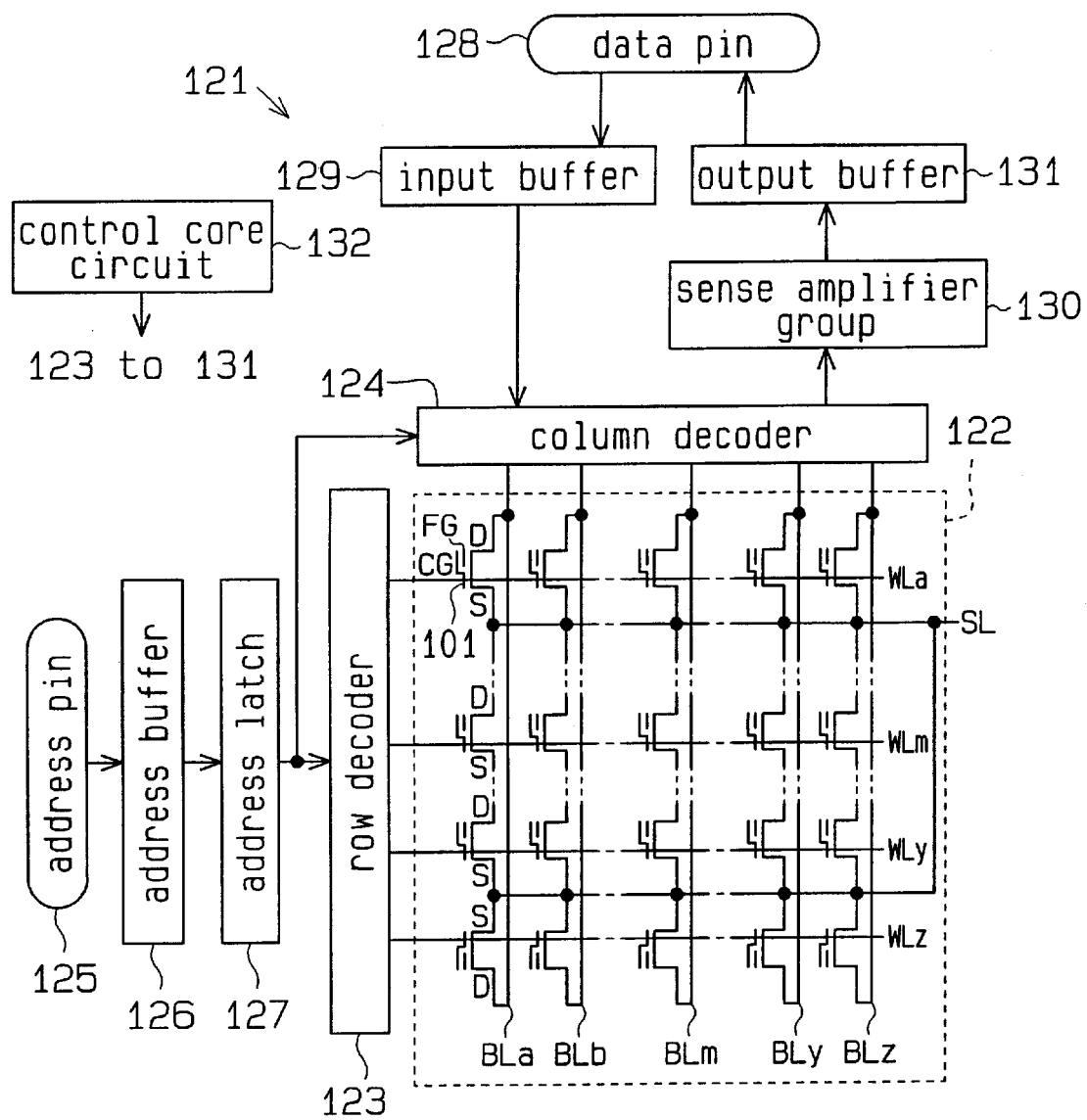

As shown in FIG. 5, a flash EEPROM 121 comprises a memory cell array 122, a row decoder 123, a column decoder 124, an address pin 125, an address buffer 126, an address latch 127, a data pin 128, an input buffer 129, a sense amplifier group 130, an output buffer 131 and a control core circuit 132. The memory cell array 122 has a matrix of split gate memory cells 101, a plurality of word lines WLa to WLz each commonly connected to the control gates CG of an associated row of memory cells 101, a plurality of bit lines BLa to BLz each commonly connected to the drains D of an associated column of memory cells 101, and a common source line SL connected to the sources S of all the memory cells 101. The word lines WL–WLz are connected to a row decoder 123, and the bit lines BLa–BLz are connected to a column decoder 124.

The address pin 125 receives a row address and a column address supplied from an external unit (not shown) and supplies those addresses to the address buffer 126. The address buffer 126 transfers the row address and column address to the address latch 127. The address latch 127 latches those addresses and transfers the row address to the row decoder 123 and the column address to the column decoder 124. The row decoder 123 selects one of the word lines WL–WLz in accordance with the row address, and controls the voltage to be applied to the selected word line in accordance with each operation mode which will be discussed later. The column decoder 124 selects one of the bit lines BLa–BLz in accordance with the column address, and controls the voltage to be applied to the selected bit line in accordance with each operation mode.

The data pin 128 receives data supplied from the external unit (not shown) and supplies the data to the input buffer 129. The input buffer 129 transfers the data to the column decoder 124. The column decoder 124 controls the voltage to be applied to any selected one of the bit lines BLa–BLz according to that data.

Data read from an arbitrary memory cell 101 is transferred from an associated one of the bit lines BLa–BLz to the sense amplifier group 130 via the column decoder 124. The sense amplifier group 130 includes a plurality of sense amplifiers (not shown). The column decoder 124 operates in such a manner as to connect the selected bit line of the bit lines BLa–BLz to each of sense amplifiers. The sense amplifier group 130 discriminates data and supplies the data to the output buffer 131 which in turn supplies the data to the data pin 128. The data read in this manner is supplied to the external unit from the data pin 128.

The control core circuit 132 controls the operations of the row decoder 123, the column decoder 124, the address pin 125, the address buffer 126, the address latch 127, the data pin 128, the input buffer 129, the sense amplifier group 130 and the output buffer 131.

The individual operation modes (word line erase mode, write mode, read mode, standby mode and bit erase mode) of the flash EEPROM 121 in this embodiment will now be discussed referring to FIGS. 6A through 7B.

(a) Word Line Erase Mode

Figure 6A:
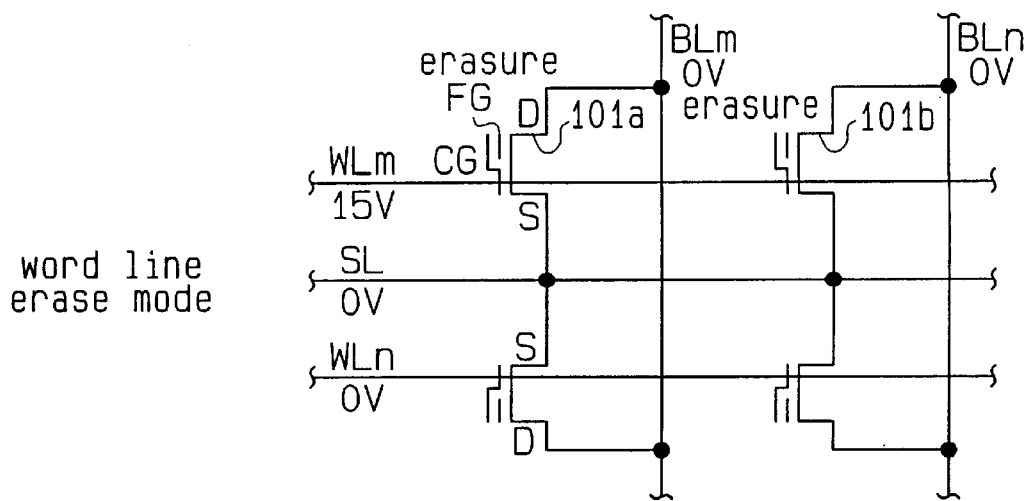
FIGS. 6A through 6C are circuit diagrams showing a part of the memory cell array used for explaining a word line erase mode, a write mode and a read mode, respectively.

As shown in FIG. 6A, a voltage of the ground level (=0 V) is applied to all the bit lines BLa–BLz and the common source line SL. A voltage of +15 V is applied to a selected word line WLm and a voltage of the ground level is applied to the other, non-selected word lines WLa–WLl and WLn–WLz. Therefore, the potentials of the control gates CG of the memory cells 101a and 101b which are connected to the selected word line WLm are pulled up to +15 V. In this manner, data is erased from all the memory cells 101 that are connected to the selected one of the word lines WL–WLz.

(b) Write Mode

Figure 6B:
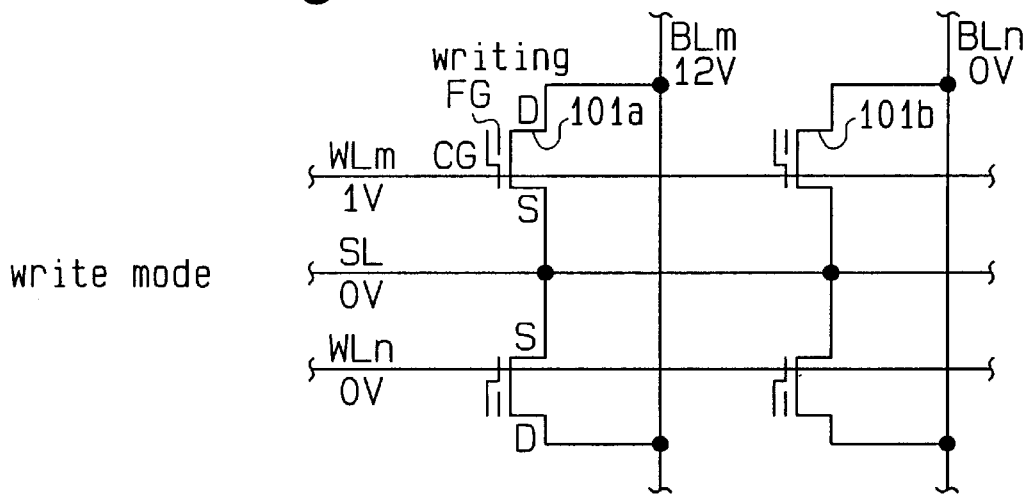

As shown in FIG. 6B, the voltage of the ground level is applied to the common source line SL. A voltage of +1 V is applied to a word line WLm associated with a selected memory cell 101a and the voltage of the ground level is applied to the other, non-selected word lines WLa–WLl and WLn–WLz. A voltage of +12 V is applied to a bit line BLm associated with the selected memory cell 101a and the voltage of the ground level is applied to the other, non-selected bit lines BLa–BLl and BLn–BLz. Note that the threshold voltage of the memory cells 101 is +1 V. Therefore, the potential of the control gate CG of the selected memory cell 101a rises to near the threshold level, causing the electrons in the source S to move into the weakly inverted channel CH. On the other hand, the voltage of +12 V is applied to the drain D, causing coupling to raise the potential of the floating gate FG. Therefore, a high electric field is produced between the control gate CG and the floating gate FG. Thus, the electrons in the channel CH are accelerated to become hot electrons which are injected into the floating gate FG. As a result, negative charges are stored in the floating gate FG of the selected memory cell 101a and 1-bit data is written. In this write mode, different from the word line erase mode, data can be written "memory cell by memory cell" manner.

(c) Read Mode

Figure 6C:
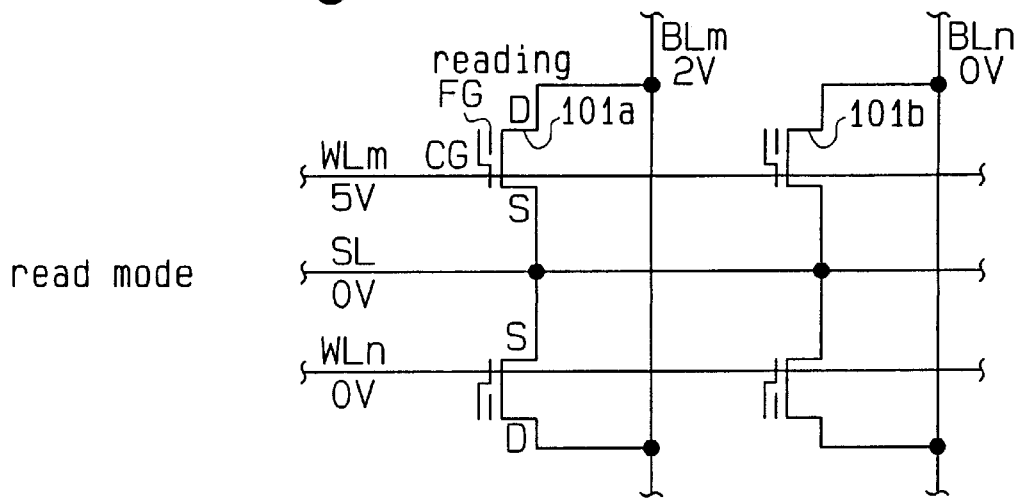

As shown in FIG. 6C, the voltage of the ground level is applied to the common source line SL. A voltage of +5 V is applied to a word line WLm associated with a selected memory cell 101a and the voltage of the ground level is applied to the other, non-selected word lines WLa–WLl and WLn–WLz. A voltage of +2 V is applied to a bit line BLm associated with the selected memory cell 101a and the voltage of the ground level is applied to the other, non-selected bit lines BLa–BLl and BLn–BLz.

Since electrons are drained from the floating gate FG of a data-erased memory cell 101, the floating gate FG is positively charged. Therefore, the channel CH directly below the positively-charged floating gate FG is enabled. Since electrons are injected into the floating gate FG of a data-written memory cell 101, the floating gate FG is negatively charged. The channel CH directly below the negatively-charged floating gate FG is disabled. When +5 V is applied to the control gate CG, therefore, the current (cell current) that flows to the source S from the drain D becomes greater for the data-erased memory cell 101 than for the data-written memory cell 101. Each sense amplifier in the sense amplifier group 130 discriminates the level of the cell current flowing in the associated memory cell 101. Depending on the discrimination result, data stored in the memory cell 101 is read as, for example, erase data "1" or write data "0". In this read mode, different from the word line erase mode, data can be read "memory cell by memory cell".

(d) Standby Mode

Figure 7A:
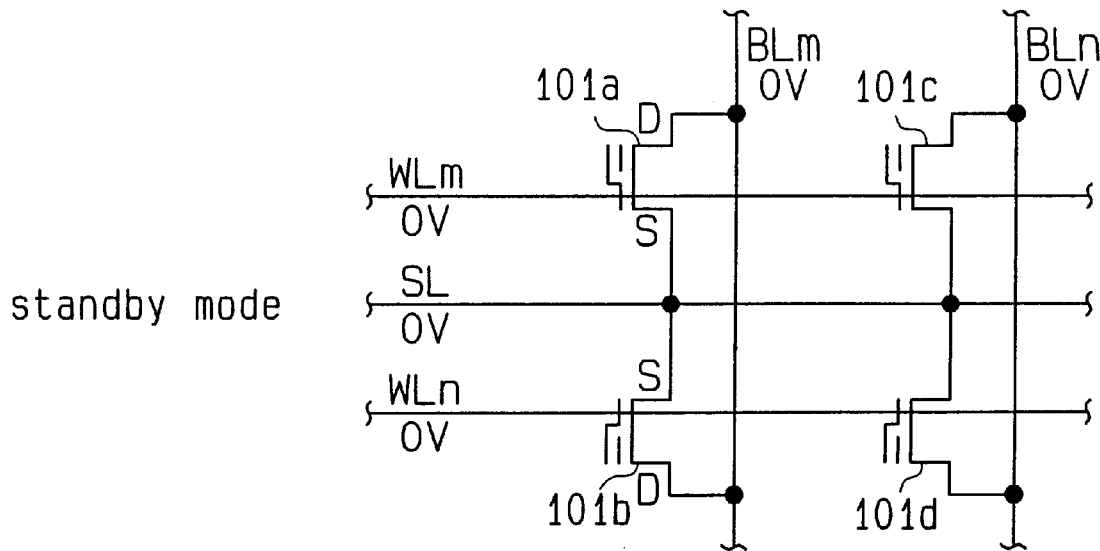

As shown in FIG. 7A, the voltage of the ground level is applied to the common source line SL, all the word lines WL–WLz and all the bit lines BLa–BLz. In this standby mode, no operation (erase operation, write operation nor read operation) is performed to any memory cell 101.

(e) Bit Erase Mode

Figure 7B:
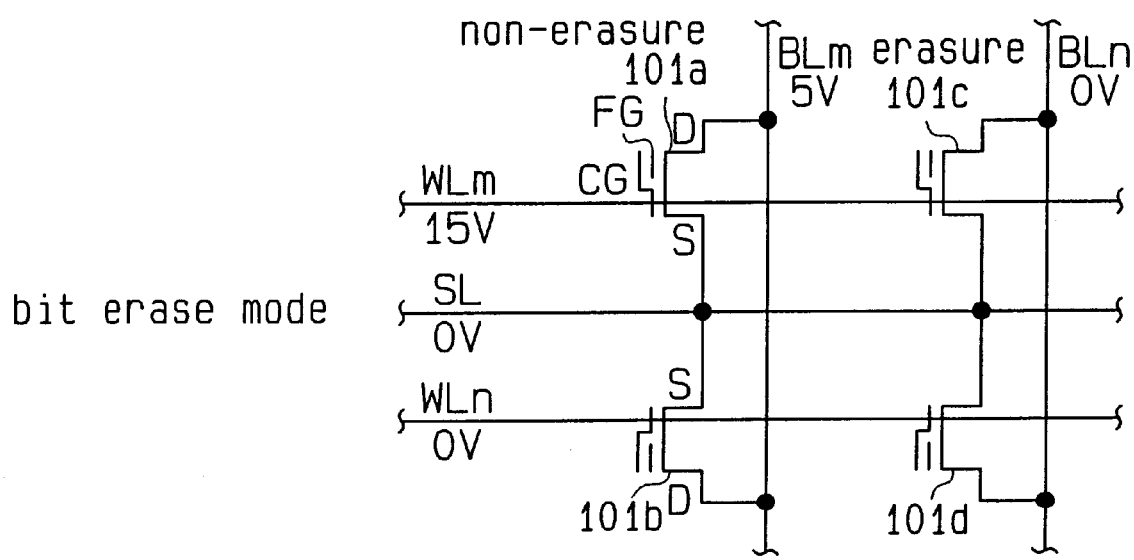

The bit erase mode will be discussed with reference to the case where, as shown in FIG. 7B, only the data that is stored in a selected memory cell 101c to be subjected to bit erasure is erased and data stored in the other, non-selected memory cells 101a, 101b and 101d are not erased.

The voltage of the ground level is applied to the common source line SL. The voltage of the ground level is applied to a bit line BLn associated with the selected memory cell 101c and a voltage of +5 V is applied to the other, non-selected bit lines BLa–BLm and BLo–BLz. A voltage of +15 V is applied to a word line WLm associated with the selected memory cell 110c and the voltage of the ground level is applied to the other, non-selected word lines WLa–WLl and WLn–WLz. The data stored in the selected memory cell 101c is erased in the same way as done in the word line erase mode.

A voltage of +5 V is applied to the other memory cell 101a connected to the word line WLm which is associated with the selected memory cell 101c. This causes electrostatic coupling which raises the potential of the floating gate FG. Consequently, the FN tunnel current does not flow due to the potential difference between the control gate CG and the floating gate FG of the memory cell 101a, despite the voltage of +15 V applied to the control gate CG. In other words, this potential difference is not large enough to permit the FN tunnel current to flow. Therefore, the electrons in the floating gate FG are not drained to the control gate CG and data stored in the non-selected memory cell 101a is not erased.

With regard to the other non-selected memory cell 101d connected to the bit line BLn associated with the selected memory cell 101c, the same voltage conditions as in the standby mode are applied, so that the data stored in the non-selected memory cell 101d is not erased.

With regard to each of the memory cells 101 (memory cell 101b) connected to the non-selected bit lines BLa–BLm and BLo–BLz and the non-selected word lines WLa–WLl and WLn–WLz, +5 V is preferably applied to the drain D. This causes electrostatic coupling which raises the potential of the floating gate FG. Since the voltage of the ground level is applied to the non-selected word lines WLa–WLl and WLn–WLz, however, the channel CH of the memory cell 101b is disabled. As a result, no hot electrons are injected into the floating gate FG of the non-selected memory cell 101b from the channel CH so that no data is written there.

According to the first embodiment, data erasure of only the selected memory cell 101c can be accomplished. That is, erasure can be performed for each selected memory cell 101 (bit by bit). This eliminates the need for erasing data stored in the other, non-selected memory cells 101 in order to erase data from one selected memory cell. In other words, it is not necessary to perform erasing and writing operations on the non-selected memory cells 101. Advantageously, this improves the durability of the memory cells 101, prevents an increase in consumed power and improves the operational speed of the flash EEPROM 121. Further, the simple erasure and writing controls reduce the burden on the control core circuit 132. This contributes to reduce the circuit area of the control core circuit 132 and improves the operational speed thereof.

Although a memory device such as a DRAM or SRAM may replace the flash EEPROM embodied in this invention, implementing a DRAM or SRAM will unfortunately increase the size of the data rewriting units. Advantageously, the flash EEPROM according to this embodiment can accomplish bit-by-bit data writing more efficiently than DRAM and SRAM cells that require larger chip space to implement the data rewriting units.

In the bit erase mode, the voltage to be applied to the non-selected bit lines BLa–BLm and BLo–BLz (+5 V in the first embodiment) should meet the following conditions.

(1) The voltage should be relatively high enough to suppress the flow of the FN tunnel current between the control gate CG and the floating gate FG of the memory cell 101a.

(2) The voltage should be relatively low enough to suppress the injection of hot electrons into the floating gate FG from the channel CH of the memory cell 101a.

(3) The voltage should be relatively low enough to suppress the flow of the FN reverse tunnel current between the control gate CG and the floating gate FG of the memory cell 101b.

(4) The voltage should preferably meet condition (1) and should still be relatively low enough to be able to reduce the flow of current (cell current) from the drain D of the memory cell 101a to the source S thereof. Specifically, the voltage of the ground level is applied to the source S of the non-selected memory cell 101a, while +5 V is applied to the drain D and +15 V is applied to the control gate CG. This voltage application causes electrostatic coupling which raises the potential of the floating gate FG to approximately +5 V, enabling the channel CH of the memory cell 101a. As a result, the cell current flows. This cell current in the bit erase mode is substantially the same as the cell current in the read mode because the voltage of the floating gate FG is relatively low. Consequently, the cell current is determined by the state of the channel CH.

Second Embodiment

The second embodiment will now be described with reference to the accompanying drawings. To avoid a redundant description, like or same reference numerals are given to those components which are the same as the corresponding components of the first embodiment. In the second embodiment, writing is performed to a given memory cell 101e in a plurality of memory cells 101 which are connected to the same word line and a simultaneous erasure is performed to another memory cell 101. For memory cells 101 which should not be written or erased, the previous states are maintained.

Write and Bit Erase Mode

Figures 8, 9:
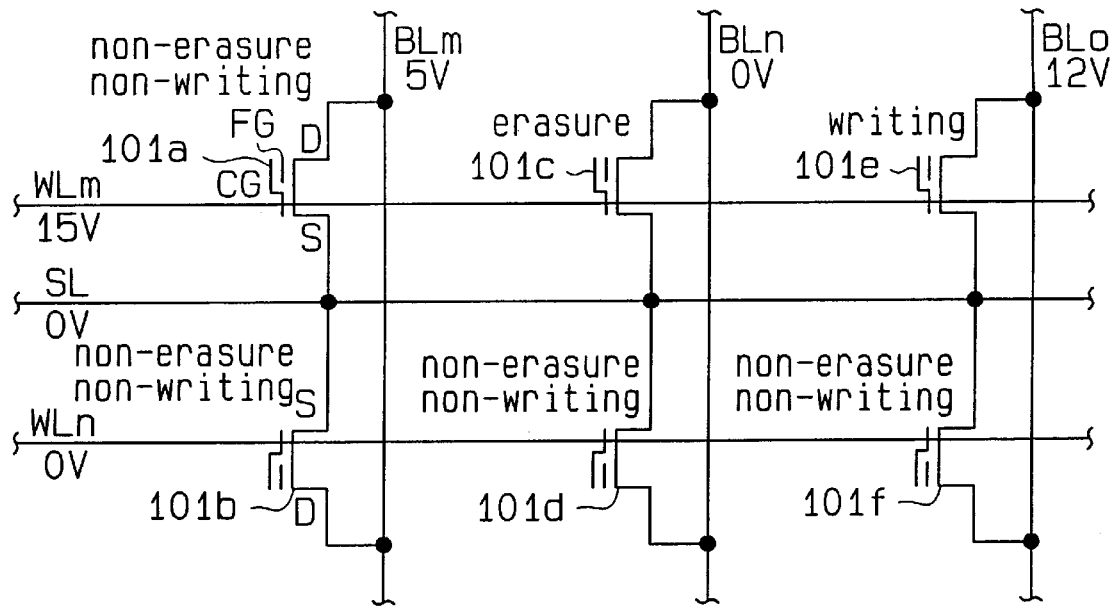

As shown in FIG. 8, while no writing nor erasure is performed to a memory cell 101a of memory cells 101a, 101c and 101e which are connected to the same word line WLm, erasure is executed to the memory cell 101c and writing is executed to the memory cell 101e.

A voltage of the ground level is applied to the common source line SL. With regard to individual memory cells 101b, 101d and 101f associated with the non-selected word lines WLa–WL1 and WLn–WLz other than the selected word line WLm, no writing nor erasure is performed and the previous states are maintained.

A voltage of +5 V is applied to the non-selected bit line BLm and +15 V is applied to the selected word line WLm. The voltage of the ground level is applied to the bit line BLn selected for erasure and the non-selected word line WLn. Further, +12 V is applied to the bit line BLo that is selected for data writing. As a result, the four memory cells 101a–101d are under substantially the same conditions as in the bit erase mode in the first embodiments.

With regard to the memory cell 101e associated with the bit line BLo and the word line WLm both selected for data writing, +12 V is applied to the drain D, which causes electrostatic coupling to pull up the potential of the floating gate FG. Consequently, a high electric field is produced between the control gate CG and the floating gate FG. Further, as the voltage of the selected word line WLm is +15 V, the channel CH of the memory cell 101e is enabled. Therefore, the electrons in the channel CH of the memory cell 101e are accelerated to be hot electrons which are injected into the floating gate FG. That is, data is written in the memory cell 101e by applying a voltage sufficient for the injection of hot electrons into the floating gate FG from the channel CH of the memory cell 101e to the bit line BLo that is selected for data writing.

As shown in FIG. 9, the voltage to be applied to each of the bit lines BLa–BLz is determined by the comparison of the data previously stored in each memory cell 101 with write data that will be newly written. By way of example, suppose that data in each memory cell 101 in the erased state has a value of "1" and data in each memory cell 101 in the written state has a value of "0". When previous data is "1" and write data is "0", the bit-line voltage is set to "+12 V" for data writing. When previous data is "0" and write data is "1", the bit-line voltage is set to "0 V" for data erasure. When previous data is "1" and write data is "1" as well, the bit-line voltage is set to "+5 V" to disable erasure and writing. When previous data is "0" and write data is "0", likewise, the bit-line voltage is set to "+5 V" to disable erasure and writing. After the setting of each bit-line voltage is completed, applying +15 V to a selected word line can advantageously permit simultaneous writing and erasing operations. For those memory cells 101 which are not selected for writing and erasing operations, the previous states are kept. Because the descriptions of the other operation modes in the second embodiment (word line erase mode, read mode and standby mode) are the same as those in the first embodiment, they are omitted here.

As apparent from the above, the second embodiment has an advantage of simultaneously writing and erasing a plurality of memory cells 101 which are connected to the same word line which are in addition to the advantages associated with first embodiment. Furthermore, data erasure or writing from or into memory cells can be executed selectively by comparing previous data already stored in each memory cell 101 with write data to be newly written. The second embodiment can therefore improve the durability of the memory cells and reduce consumed power, as well as increase operational speeds. Accordingly, the second embodiment eliminates wasteful erasure and writing operations.

Figure 10:
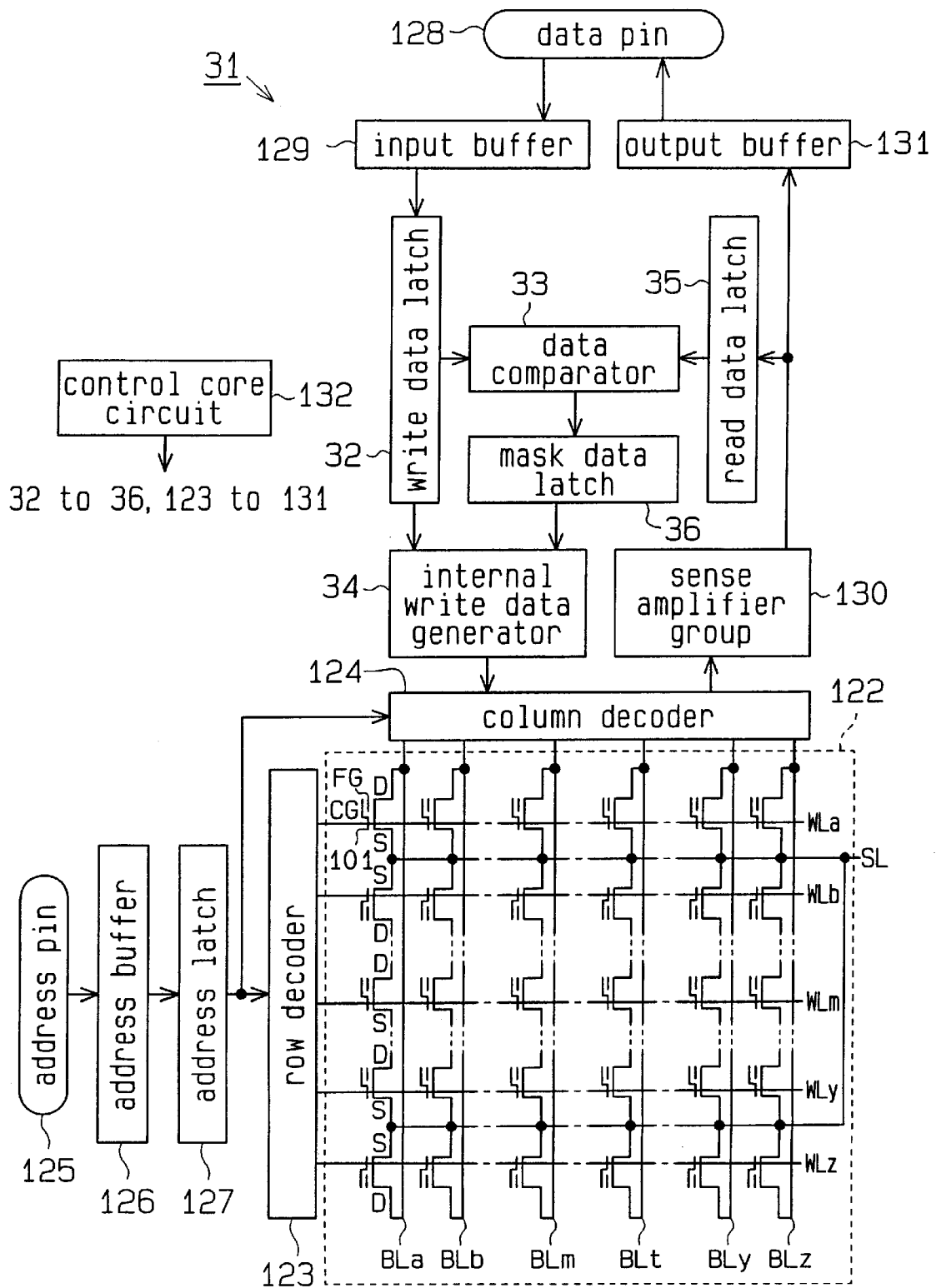

As mentioned above, conventional erasures and writings are quite wasteful. By way of example, when a given memory cell is already in an erased state (i.e., data of "1"), and data to be newly written is an erased state "1", a data erasure will nonetheless be wastefully performed before a writing operation is executed. Likewise, when a given memory cell is already in a written state (i.e., data of "0"), and data to be newly written is "0", a data erasure will also be wastefully performed before a writing operation is executed. In other words, the second embodiment of this invention advantageously avoids having to needlessly erase a memory cell each time an erase or write having the same value is performed, As shown in FIG. 10, a flash EEPROM 31 according to the second embodiment comprises a memory cell array 122, a row decoder 123, a column decoder 124, an address pin 125, an address buffer 126, an address latch 127, a data pin 128, an input buffer 129, a sense amplifier group 130, an output buffer 131, a write data latch 32, a data comparator 33, an internal write data generator 34, a read data latch 35, a mask data latch 36 and a control core circuit 132.

The input buffer 129 receives 1-byte write data, supplied from an external unit, via the data pin 128, and transfers the write data to the write data latch 32. The write data latch 32 latches the write data and supplies the data to the data comparator 33 and the internal write data generator 34.

One-byte read data is read from arbitrary eight memory cells 101 which are connected to the same word line. The column decoder 124 receives the read data from the individual bit lines BLa–BLz, and supplies the data to the sense amplifier group 130. The sense amplifier group 130 discriminates the read data and supplies the data to the read data latch 35 and the output buffer 131. The read data latch 35 latches the read data and supplies it to the data comparator 33.

The data comparator 33 compares the write data with the read data "bit by bit" to generate 1-byte mask data, and supplies the mask data to the mask data latch 36. The mask data latch 36 latches the mask data and supplies the mask data to the internal write data generator 34. The internal write data generator 34 determines the voltages to be applied to the individual bit lines BLa–BLz based on the write data and mask data. In accordance with the determination by the internal write data generator 34, the column decoder 124 controls the voltages to be applied to the individual bit lines BLa–BLz. The control core circuit 132 controls the operations of the row decoder 123, the column decoder 124, the address pin 125, the address buffer 126, the address latch 127, the data pin 128, the input buffer 129, the sense amplifier group 130, the output buffer 131, the write data latch 32, the data comparator 33, the internal write data generator 34, the read data latch 35 and the mask data latch 36.

Figure 11:
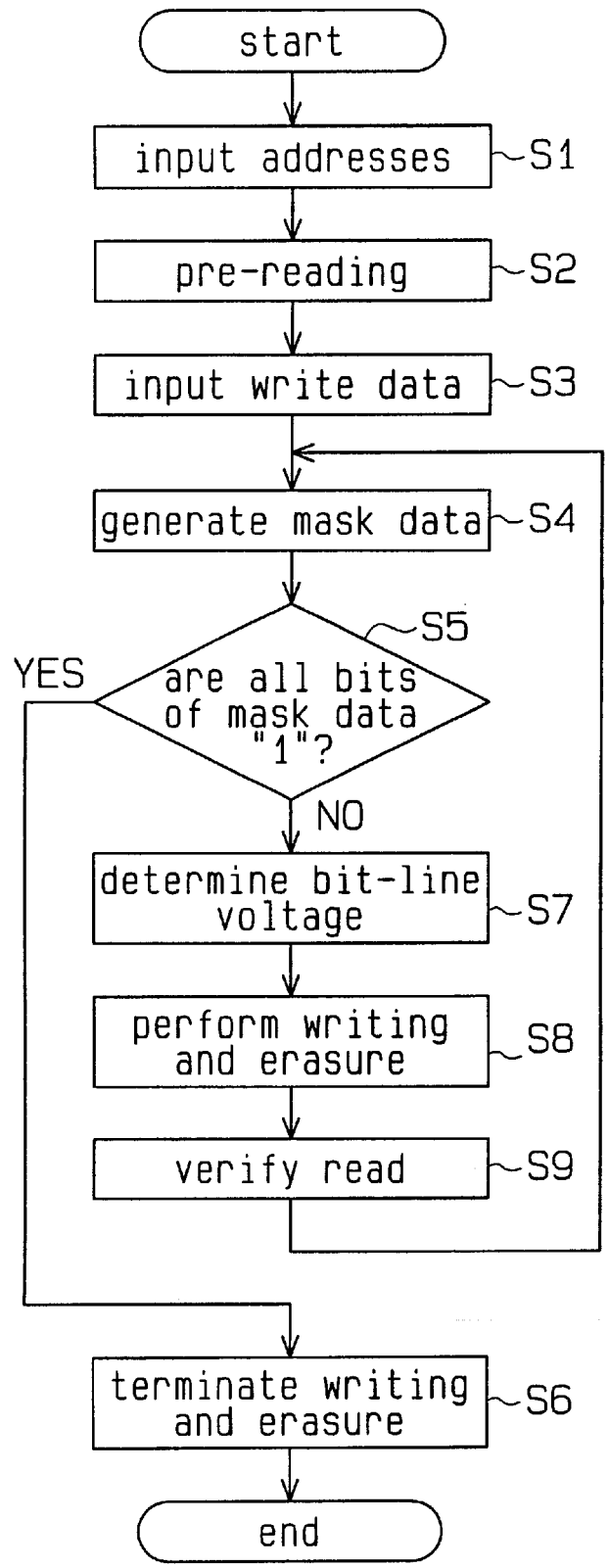

Referring now to FIGS. 10 through 12, a detailed description will now be given for the "write" and "bit erase" mode operation in accordance with one embodiment of the second embodiment. As shown in FIG. 11, the row address and column address input to the address pin 125 are transferred to the address latch 127 via the address buffer 126 in step 1. As a result, the row address and column address are latched by the address latch 127.

In step 2, pre-reading is performed. Specifically, the row address latched by the address latch 127 is transferred to the row decoder 123, and the column address to the column decoder 124. The row decoder 123 selects one of the word lines WL–WLz (e.g., WLm) in accordance with the row address. The column decoder 124 selects eight bit lines from the bit lines BLa–BLz (e.g., BLm–BLt) in accordance with the column address. Consequently, 1-byte read data is read from eight memory cells 101 which are associated with the word line WLm and the bit lines BLm–BLt. This read data is transferred to the sense amplifier group 130 via the bit lines BLm–BLt and the column decoder 124. The sense amplifier group 130 discriminates the read data and the read data latch 35 latches the discriminated read data.

In step 3, 1-byte write data input to the data pin 128 is transferred to the write data latch 32 via the input buffer 129, and the write data latch 32 latches the write data.

In step 4, the data comparator 33 generates mask data. Specifically, the data comparator 33 receives the write data latched by the write data latch 32 and the read data latched by the read data latch 35, and compares the write data with the read data "bit by bit". When the bits of both data match with each other, the value of the associated bit in eight bits of the mask data is set to "1". When the compared bits do not match with each other, the value of the associated bit in the mask data is set to "0". The mask data latch 36 then receives the generated 1-byte mask data from the data comparator 33 and latches the appropriate data.

In step 5, the control core circuit 132 receives the 1-byte mask data from the data comparator 33 and determines if the individual bit values of the mask data are all "1". When those bit values are all "1", the flow advances to step 6 to terminate the writing and erasing operations. When any bit has a value of "0", the flow proceeds to step 7 to execute the writing and erasing operations.

In step 7, the internal write data generator 34 determines the voltages to be applied to the bit lines BLm–BLt which are associated with the individual bits of the write data and mask data, based on the comparison of the write data with the mask data.

In step 8, the column decoder 124 controls the individual voltages such that the voltages determined by the internal write data generator 34 are applied to the associated bit lines BLm–BLt. The row decoder 123 then applies +15 V to the selected word line WLm. As a result, writing and erasure are simultaneously performed to the memory cells 101 which are associated with the word line WLm and the bit lines BLm–BLt. For those memory cells 101 which should not undergo writing and erasing operations, the previous states are kept.

In step 9, a read operation for verification after writing and erasure is performed. After writing and erasure are executed for a given period of time, 1-byte verify read data is read from the individual memory cells 101 associated with the word line WLm and the bit lines BLm–BLt as in step 2. The read data latch 35 then latches the verify read data. As a result, the previous read data previously latched in the read data latch 35 is replaced with the verify read data that has been newly read out from the associated memory cells 101.

Next, the flow returns to step 4 to generate mask data and the processes in steps 5 to 9 are repeated. Through this sequence of processes, mask data whose bit values are all "1" can be acquired even if the characteristics of the individual memory cells 101 differ from one another. In other words, the write data can be matched with the verify read data for all bits. At this point, the writing and reading operations are terminated in step 6.

Third Embodiment

Figure 13:
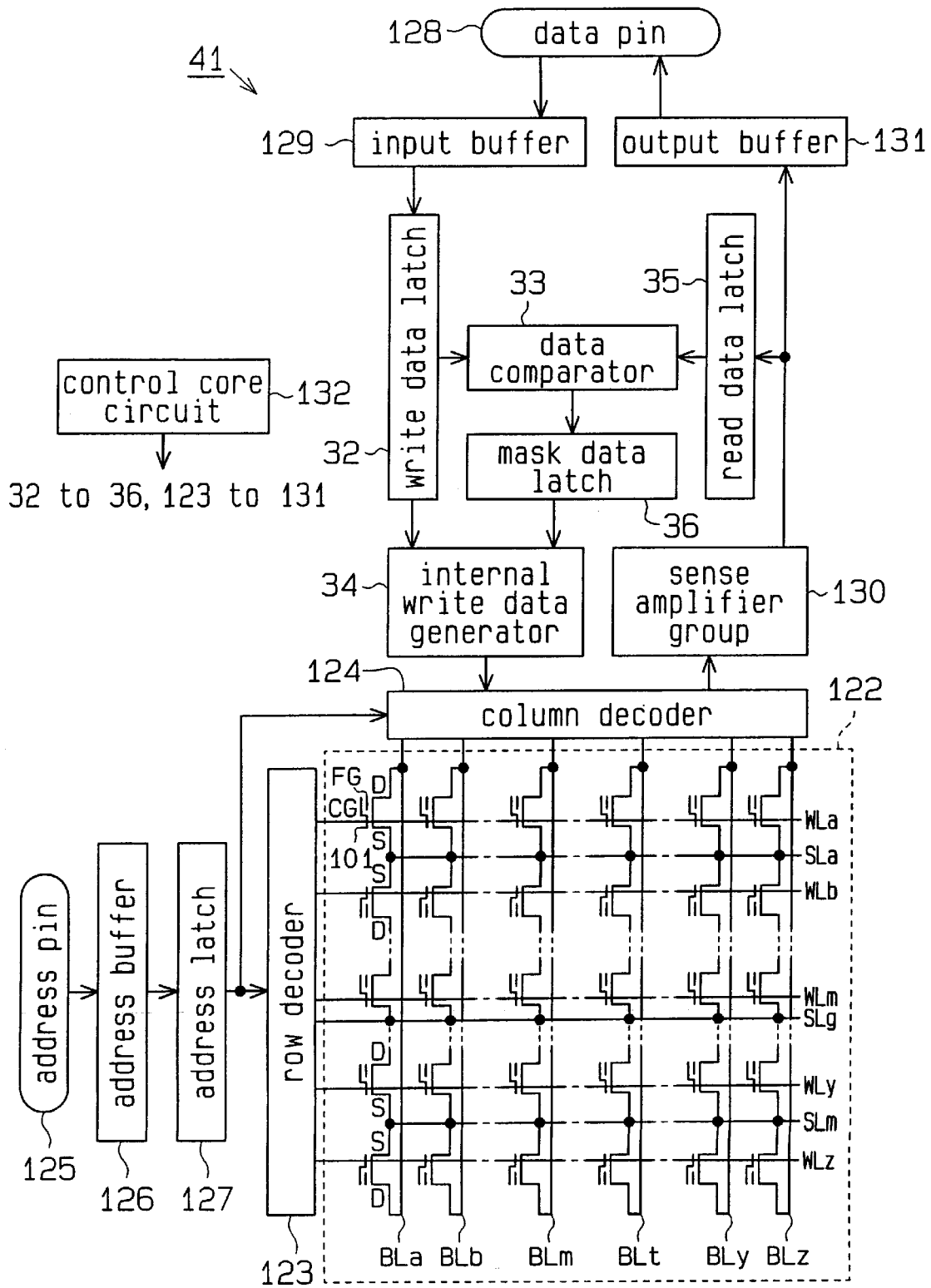

The third embodiment will now be described with reference to the accompanying drawings. To avoid a redundant description, like or same reference numerals are given to those components which are the same as the corresponding components of the first and second embodiments. As shown in FIG. 13, a memory cell array 122 of a flash EEPROM 41 according to the third embodiment has source lines SLa to SLm each of which is commonly connected to the sources S of two groups of memory cells associated with adjoining odd and even word lines in the word lines WL–WLz. Specifically, the sources S of two groups of memory cells respectively connected to the odd and even word lines WLa and WLb are connected to the source line SLa. The sources S of two groups of memory cells respectively connected to the odd and even word lines WLm and WLn are connected to the source line SLg. The sources S of two groups of memory cells respectively connected to the odd and even word lines WLy and WLz are connected to the source line SLm.

The row decoder 123 not only selects the proper one of the word lines WL–WLz and controls the voltage to be applied to the selected word line, but also selects one of the source lines SLa–SLm in accordance with the row address and controls the voltage to be applied to the selected source line in accordance with each operation mode.

Bit Erase Mode

Figure 14:
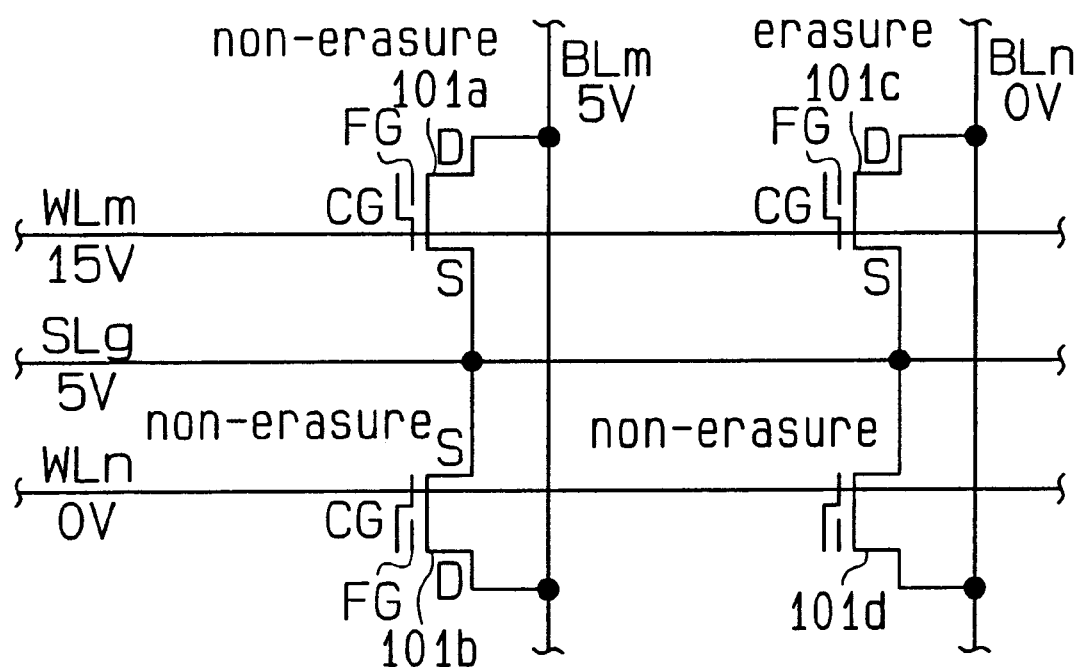
Figure 15:
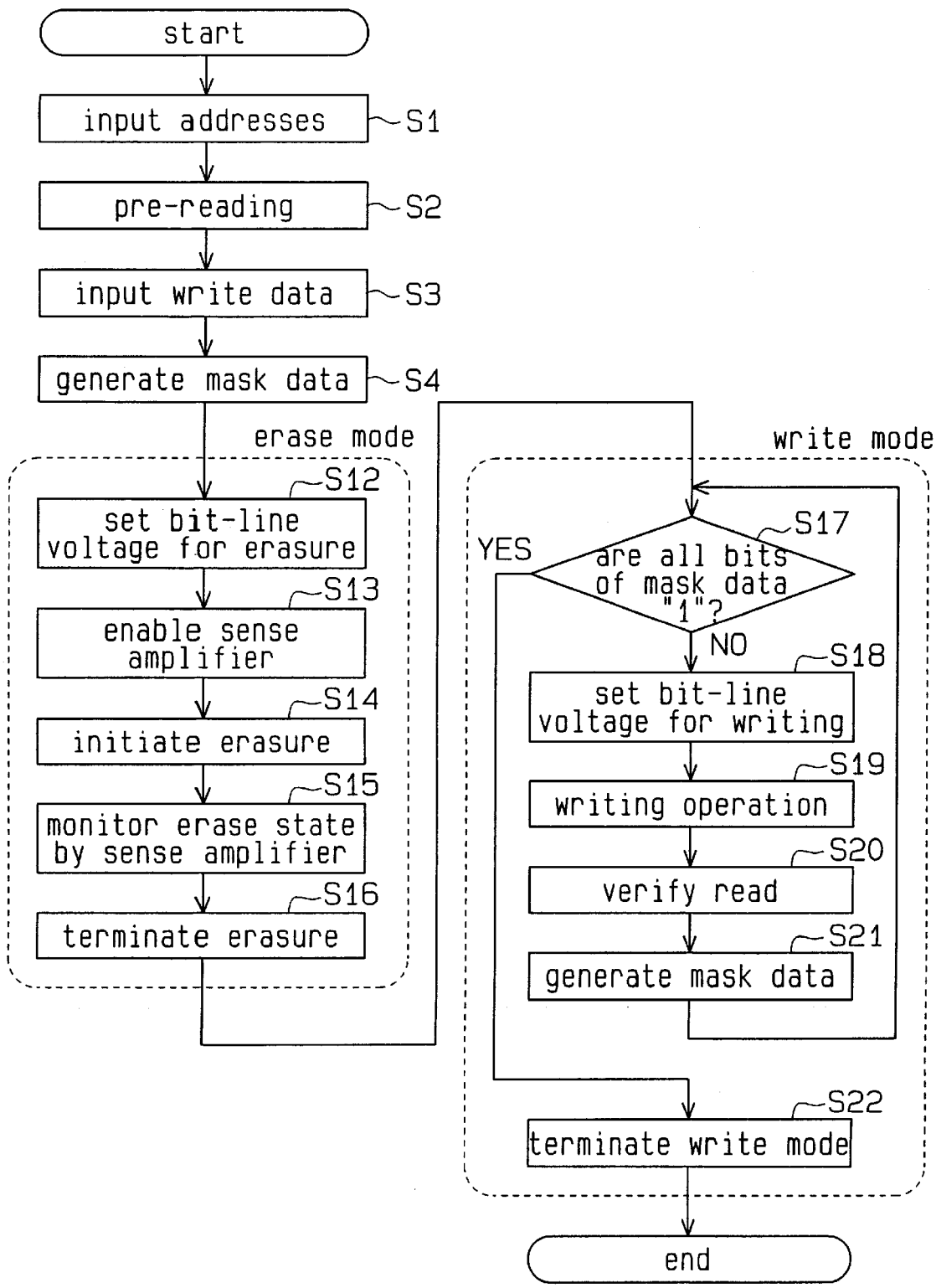

In the bit erase mode in the third embodiment, as shown in FIG. 14, the same voltage as the voltage (=+5 V) that is applied to the bit line BLm associated with the non-selected memory cell 101a is applied to the source line SLg which is associated with the memory cell 101c that has been selected to be erased. The channels CH of another non-selected memory cells 101b and 101d are disabled because of the voltage of the ground level applied to the associated word line WLn. Even if the voltage of the source line SLg rises, therefore, erasing and writing of those memory cells 101b and 101d are not carried out and no cell current flows there. In the first and second embodiments, the cell current flows in the non-selected memory cell 101a whose retained data is not erased. In the third embodiment, however, the cell current does not flow through the channel CH of the memory cell 101a because +5 V is applied to the both the source S and drain D of the memory cell 101a which means no potential difference exists between the source S and drain D. This permits further reduction of the consumed power for the flash EEPROM 41.

The memory cell 101c which has been selected for erasure is holding the written state and electrons are injected into its floating gate FG. The floating gate FG is therefore negatively charged, so that the channel CH directly below the floating gate FG of the memory cell 101c is disabled before +15 V is applied to the associated word line WLm. Consequently, the cell current does not flow through the channel CH regardless of the potential difference of +5 V between the source S and the drain D. When +15 V is applied to the word line WLm, erasure starts and the potential of the floating gate FG rises, allowing the cell current to flow. As the erasure operation progresses, the cell current increases and becomes maximum when the erasure is completed.

According to the third embodiment, as apparent from the above, the cell current does not advantageously flow through the other memory cell 101a connected to the same word line WLm to which the memory cell 101c selected for erasure is connected. The cell current however flows through the memory cell 101c selected for erasure. When the number of memory cells 101 to be simultaneously erased is relatively small (i.e., about in a range from 1 bit to 1 byte), the total amount of cell current is not so large. As a result, there is minimal influence of the cell current flowing through the memory cell selected for erasure on power consumption. In this embodiment, this cell current flowing through the memory cell selected for erasure is substantially the same as the cell current of the read mode.

Monitoring the cell current flowing through the memory cell 101c selected for erasure permits detecting the progression of erasing operations. This detection enables the optimization of the quantity of charges to be stored in the floating gate FG. In other words, it is possible to accurately detect the timing at which erasure is terminated, thus erasing operations are completed much faster. Since the descriptions of the other operation modes of the flash EEPROM 41 (word line erase mode, write mode, read mode and standby mode) are the same as those in the first embodiment, they are omitted.

It should also be appreciated that in the bit erase mode, the voltages to be applied to the non-selected bit lines BLa–BLm and BLo–BLz and any of the source lines SLa–SLm associated with the selected memory cell 101 should preferably satisfy the following condition (4) as well as conditions (1) to (3) in the first embodiment.

(4) The voltage should meet the condition (1) and should still be relatively low to reduce the source current of the memory cell 101c.

Referring now to FIGS. 14 through 17, a detailed description will now be given of the bit erase mode and write mode according to the third embodiment. Because steps 1 to 4 in the flowchart in FIG. 15 that illustrate the bit erase mode and write mode are substantially the same as steps 1 to 4 in the flowchart of the second embodiment in FIG. 11, the descriptions of those steps 1 to 4 are not repeated.

After mask data is generated through the execution of processes in steps 1 to 4, the flow proceeds to step S12. In steps 12 to 16, processing in the bit erase mode is performed. In step 12, based on the write data and the mask data, the internal write data generator 34 determines the voltages to be applied to the bit lines BLm–BLt, which are associated with the write data and mask data, as shown in FIG. 16. In step 13, the control core circuit 132 connects each of the bit lines BLm–BLt to the associated sense amplifier to enable that sense amplifier.

In step 14, the column decoder 124 controls the individual voltages such that the voltages determined by the internal write data generator 34 are applied to the associated bit lines BLm–BLt. The row decoder 123 applies +15 V to the selected word line WLm and applies +5 V to the selected source line SLg. As a result, erasure of eight memory cells 101 which are associated with the word line WLm and the bit lines BLm–BLt is initiated.

In step 15, the sense amplifiers connected to the respective bit lines BLm–BLt monitor the cell currents flowing through the eight memory cells 101 associated with the bit lines BLm–BLt. Monitoring in this manner allows the progression of erasure of the memory cells to be detected. In step 16, when the cell current of each memory cell 101 detected by the associated sense amplifier reaches a predetermined value, the control core circuit 132 controls the column decoder 124 to terminate the erasing operation.

In steps 17 to 21, processing in the write mode is performed. In step 17, the control core circuit 132 determines if all the bit values of 1-byte mask data are all "1". When the bit values are all "1", the flow advances to step 19 to terminate the write mode. When any bit has a value of "0", the flow proceeds to step 18 to initiate the write mode processing.

In step 18, based on the comparison of the write data with the mask data, the internal write data generator 34 determines the voltages to be applied to the bit lines BLm–BLt, which are associated with the write data and mask data, as shown in FIG. 17. In step 19, the column decoder 124 controls the individual voltages in such a manner that the voltages determined by the internal write data generator 34 are applied to the associated bit lines BLm–BLt. The row decoder 123 applies +1 V to the selected word line WLm and applies the voltage of the ground level to the selected source line SLg. As a result, data writing to the eight memory cells 101 associated with the word line WLm and the bit lines BLm–BLt is performed.

In step 20, a read operation for verification after erasure and writing is performed. This step 20 is the same as step 9 in the second embodiment. After mask data is generated in step 21, the flow returns to step 17. The step 21 is the same as the above-discussed step 4. As the sequence of steps 17 to 21 is repeated, mask data whose bit values are all "1" can be acquired even if the characteristics of the individual memory cells 101 vary from one another. In other words, the write data can be matched with the read data in every bit. Then, the write mode is terminated in step 22.

Fourth Embodiment

Figure 18:
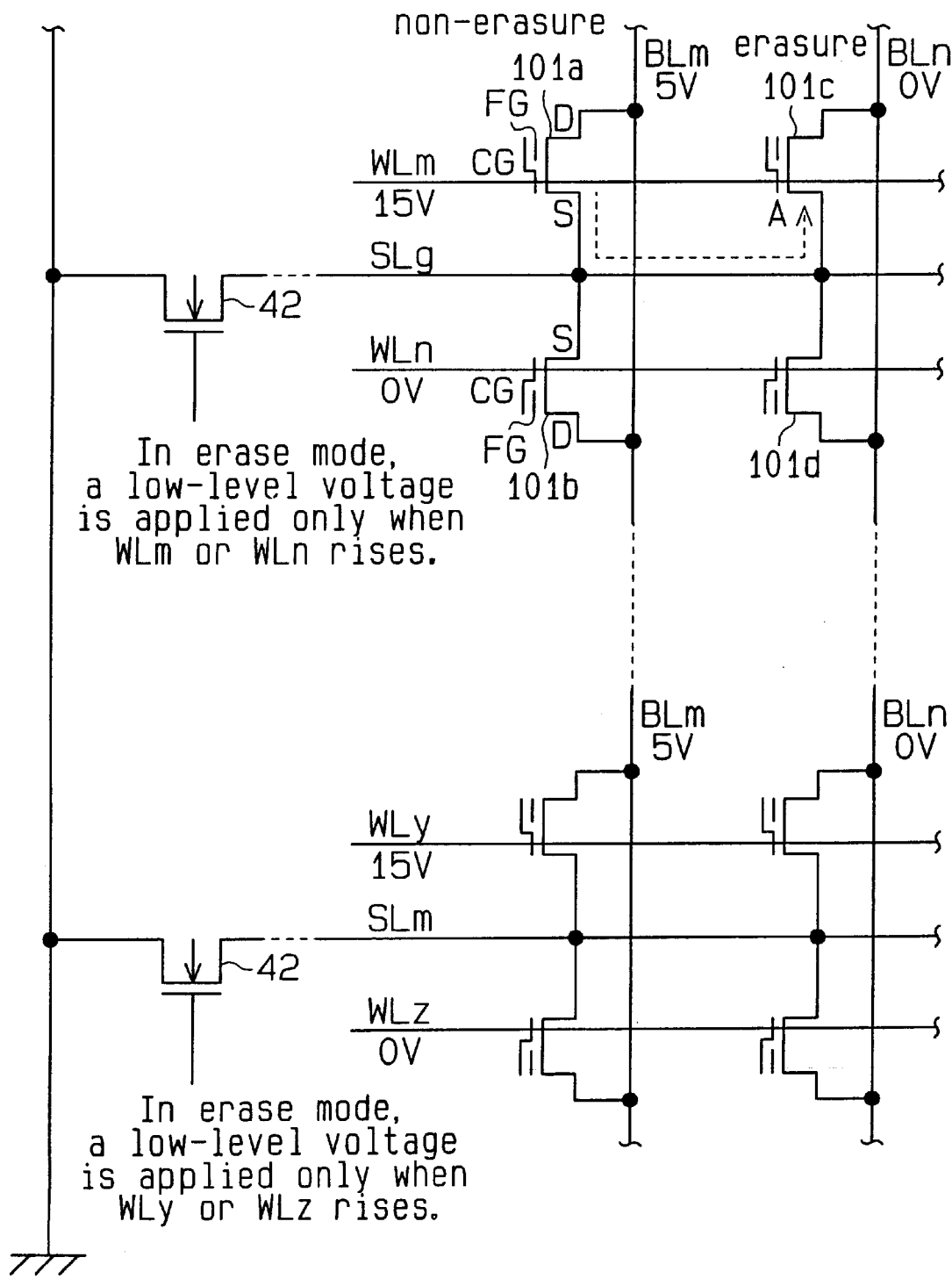
FIG. 18 is a circuit diagram showing a part of a memory cell array in a non-volatile semiconductor memory device according to a fourth embodiment of the invention.

The fourth embodiment will now be described with reference to the accompanying drawings. To avoid a redundant description, like or same reference numerals are given to those components which are the same as the corresponding components of the third embodiment. As shown in FIG. 18, a memory cell array 122 according to the fourth embodiment has a plurality of NMOS transistors 42 connected between the individual source lines SLa–SLm and the ground. Each NMOS transistor 42 has a gate for receiving a control signal supplied from the row decoder 123. In bit erase mode, when the voltage of the selected word line rises, a control signal of a low level is applied to the gate of the NMOS transistor 42 associated with the source line which is connected via the associated memory cells 101 to the selected word line. The NMOS transistor 42 is therefore turned off only in bit erase mode, setting the source line connected to the disabled transistor 42 to the floating state. The floating state prevents cell currents from constantly flowing through the memory cells 101*a* and 101*c* in bit erase mode. Thus, the fourth embodiment can accomplish the same reduction of the consumed power as done by the third embodiment. As a result, the cell current flowing through the memory cell selected for erasure is substantially same the cell current in the read mode.

Fifth Embodiment

Figure 19:
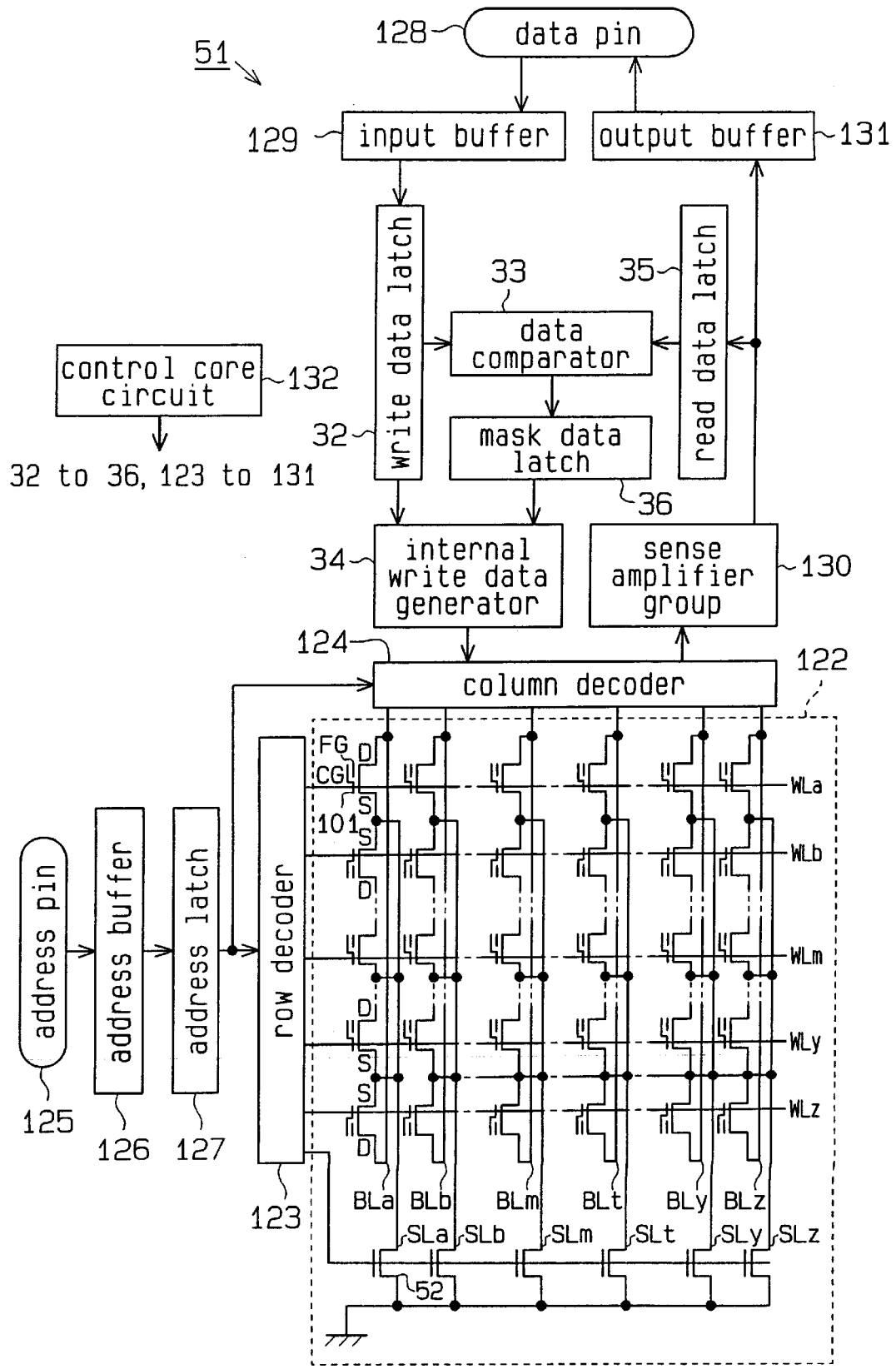
FIG. 19 is a block diagram illustrating a non-volatile semiconductor memory device according to a fifth embodiment of the invention.
Figure 20:
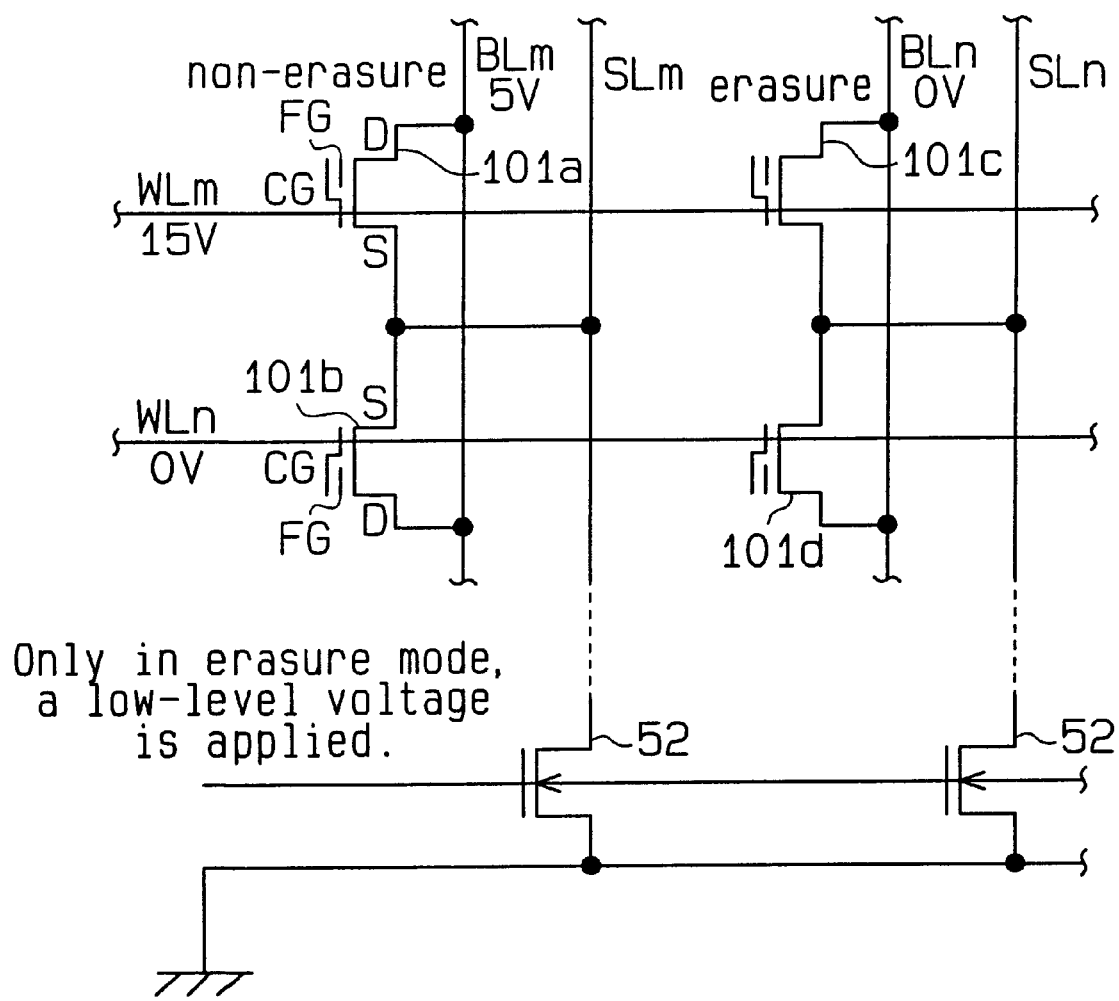
FIG. 20 is a circuit diagram showing a part of a memory cell array in the non-volatile semiconductor memory device in FIG. 19.

The fifth embodiment will now be described with reference to the accompanying drawings. To avoid a redundant description, like or same reference numerals are given to those components which are the same as the corresponding components of the fourth embodiment. As shown in FIG. 19, a memory cell array 122 of a flash EEPROM 51 according to the fifth embodiment has individual source lines SLa to SLz and a plurality of NMOS transistors 52 connected between the respective source lines SLa–SLz, which correspond in a one-to-one relation to the bit lines BLa–BLz, and the ground. That is, the sources S of the individual memory cells 101 connected to the same bit line are commonly connected to one source line. In bit erase mode, a control signal of a low level is applied to the gate of the NMOS transistor 52 associated with the memory cell to be erased. This control signal is generated by the control core circuit 132. This control signal disables the NMOS transistor 52 to cause the source line connected to the to-be-erased memory cell to float.

When erasure of the memory cell 101*c* progresses and its channel CH is enabled, the current flows as indicated by a broken-lined arrow A in the fourth embodiment shown in FIG. 18. The current path runs like the bit line BLm (+5 V applied) connected to the non-selected memory cell 101*a*→source line SLg→selected memory cell 101*c*→bit line BLn (=0 V) connected to the selected memory cell 101*c*. Note that when the total number of the memory cells 101 to be simultaneously erased lies within a range of about 1 to 8, the total amount of the current is relatively small. According to the fourth embodiment, therefore, the consumed power can be reduced by limiting the number of memory cells 101 that are simultaneously erased. According to the fifth embodiment, as opposed to the fourth embodiment, because the source lines SLa–SLz corresponding to a one-to-one relation to the bit lines BLa–BLz are provided, the current which flows in the fourth embodiment does not flow here. Even if the number of the memory cells 101 to be simultaneously erased is increased, therefore, the fifth embodiment can still reduce power consumption.

Sixth Embodiment

The sixth embodiment will now be described with reference to the accompanying drawings. To avoid a redundant description, like or same reference numerals are given to those components which are the same as the corresponding components of the first to fifth embodiments. The sixth embodiment relates to a flash EEPROM capable of storing multi-value data in memory cells 101.

Figure 21:
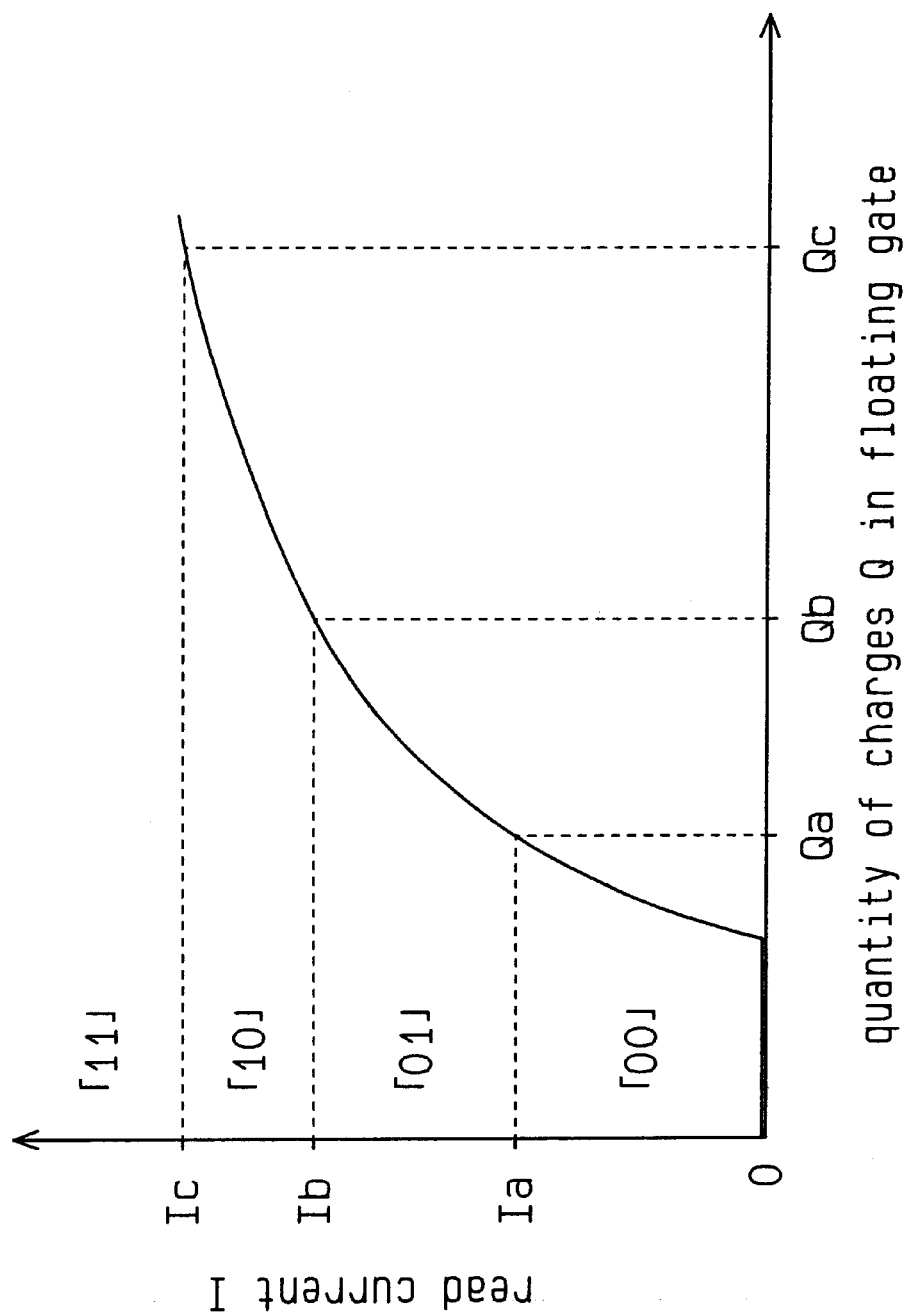

FIG. 21 presents a characteristic graph showing the relationship between the quantity of charges Q in the floating gate FG and the read current (cell current) I. The quantity of charges Q in the floating gate FG is proportional to the read current I, and the proportional characteristic is substantially similar to the proportional characteristic between a gate voltage $V_{GS}$ and a drain current $I_D$ of an enhancement type NMOS transistor.

As apparent from the above, the read current I is specifically determined by the quantity of charges Q in the floating gate FG. The quantity of charges Q in the floating gate FG can be controlled by adjusting erasing or writing times. The control on the quantity of charges Q in the floating gate FG permits the read current I to be set arbitrarily. When the read current I is lower than an arbitrary value Ia (I<Ia) as shown in FIG. 21, for example, a data value "00" is associated with this case. When the read current I is greater than the value Ia and lower than an arbitrary value Ib (Ia<I<Ib), a data value "01" is associated with this case. When the read current I is greater than the value Ib and lower than an arbitrary value Ic (Ib<I<Ic), a data value "10" is associated with this case. When the read current I is greater than Ic (I>Ic) as shown in FIG. 21, for example, a data value "11" is associated with this case. Such association of a data value allows data of four values (=2 bits) to be stored in a single memory cell 101.

Figure 22:
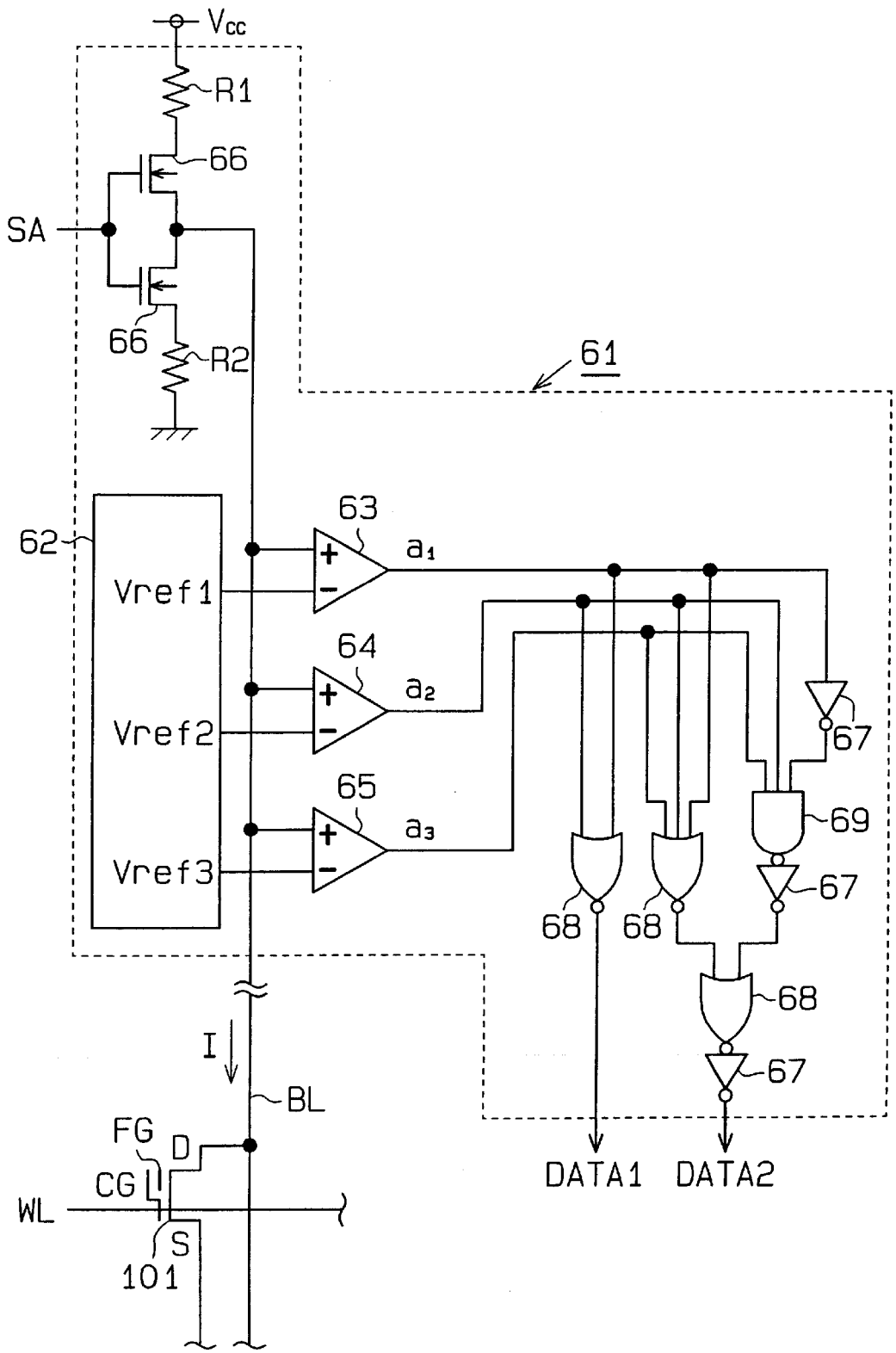

FIG. 22 is a circuit diagram showing a sense amplifier 61 for reading 4-value data from the memory cell 101. The sense amplifier 61 includes a reference voltage generator 62, three comparators 63 to 65, two NMOS transistors 66, three inverters 67, three NOR gates 68, one NAND gate 69, and two resistors R1 and R2. This sense amplifier 61 operates in the following manners.

(1) In the initial state, a signal SA and a word line WL both have low-level voltages.

(2) When the signal SA rises, the NMOS transistors 66 are turned on, and +2 V is applied to the bit line BL by the resistors R1 and R2.

(3) When the word line WL rises, the read current I flows through the memory cell 101 so that the voltage of the bit line BL drops from +2 V.

(4) Suppose that the voltage of the bit line BL is represented by a reference voltage Vref1 when the read current I having an arbitrary value Ia flows. Also suppose that the voltage of the bit line BL is represented by a reference voltage Vref2 when the read current I having an arbitrary value Ib flows, and that the voltage of the bit line BL is represented by a reference voltage Vref3 when the read current I having an arbitrary value Ic flows. The reference voltage generator 62 generates the individual reference voltages Vref1, Vref2 and Vref3 and supplies those reference voltages Vref1, Vref2 and Vref3 to the negative input terminals of the associated comparators 63 to 65. The comparators 63–65 have positive input terminals connected to the bit line BL.

(5) The comparators 63–65 compare the potential of the bit line BL with the associated reference voltages Vref1, Vref2 and Vref3, and supply the comparison results a1, a2 and a3 to one inverter 67, one NOR gate 68 and the NAND gate 69, respectively.

(6) As shown in FIG. 23, the sense amplifier 61 determines the values of read data DATA1 and DATA2 based on the voltages of the outputs a1, a2 and a3 of the comparators 63–65. Both read data DATA1 and DATA2 indicate the aforementioned 4-value data. The use of the sense amplifier 61 can therefore allow 4-value data stored in the memory cell 101 to be read in accordance with the read current (cell current) I that flows through the memory cell 101.

Figure 24:
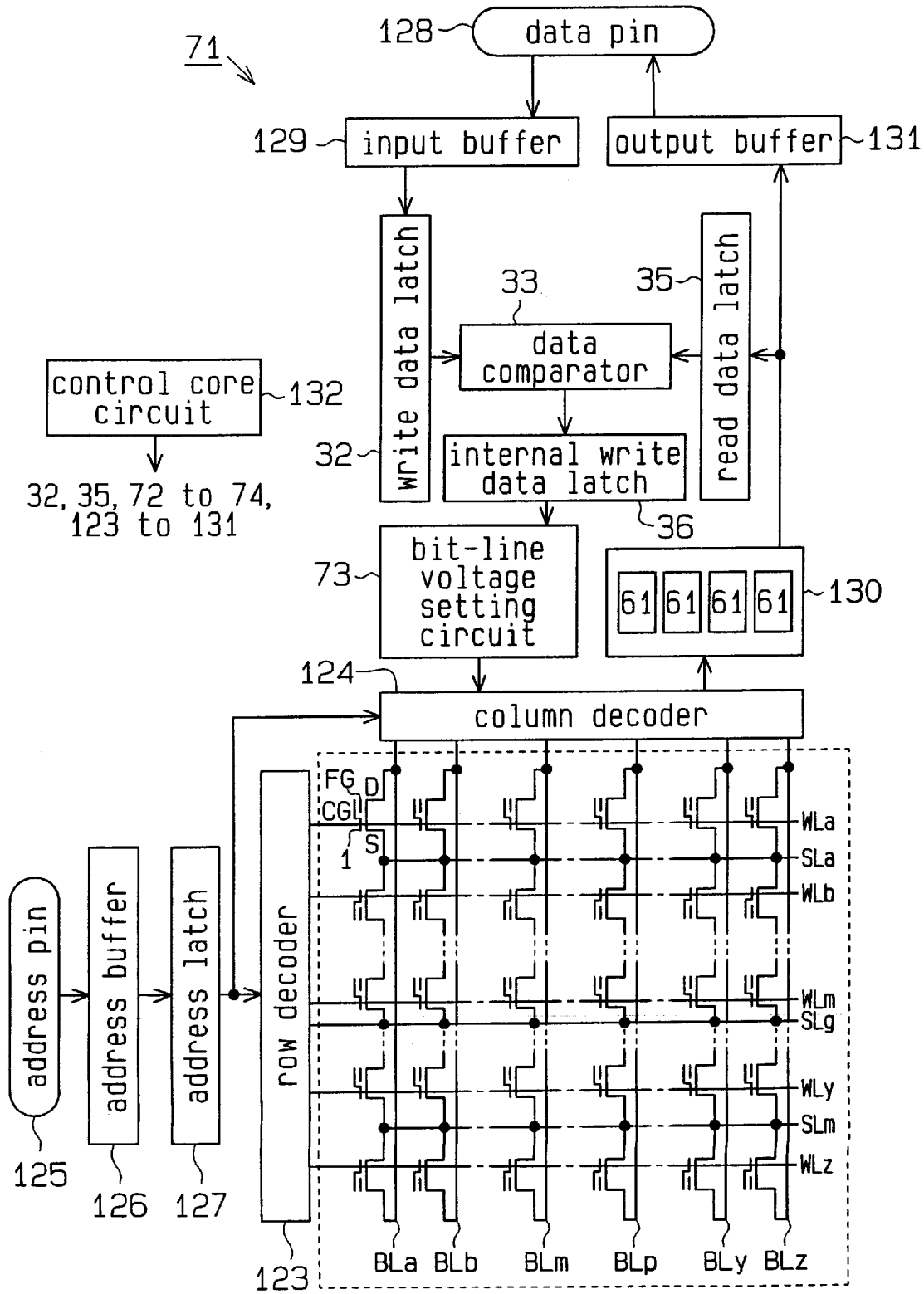

As shown in FIG. 24, a flash EEPROM 71 according to the sixth embodiment comprises a memory cell array 122, a row decoder 123, a column decoder 124, an address pin 125, an address buffer 126, an address latch 127, a data pin 128, an input buffer 129, a sense amplifier group 130 including four sense amplifiers 61, an output buffer 131, a write data latch 32, a read data latch 35, an internal write data latch 72, a bit-line voltage setting circuit 73, a data comparator 74 and a control core circuit 132.

The data comparator 74 compares write data (2 bits) to be written in one memory cell 101 with read data (2 bits) with respect to four consecutive memory cells 101, and generates internal write data of a total of 1 byte based on the comparison results. The internal write data latch 72 latches the internal write data and supplies it to the bit-line voltage setting circuit 73. Based on the internal write data, the bit-line voltage setting circuit 73 determines the voltages to be applied to the individual bit lines BLa–BLz. The column decoder 124 controls the individual voltages in such a way that the voltages determined by the bit-line voltage setting circuit 73 are applied to the respective bit lines BLa–BLz. The control core circuit 132 controls the operations of the row decoder 123, the column decoder 124, the address pin 125, the address buffer 126, the address latch 127, the data pin 128, the input buffer 129, the sense amplifier group 130, the output buffer 131, the write data latch 32, the read data latch 35, the internal write data latch 72, the bit-line voltage setting circuit 73 and the data comparator 74.

Figure 25:
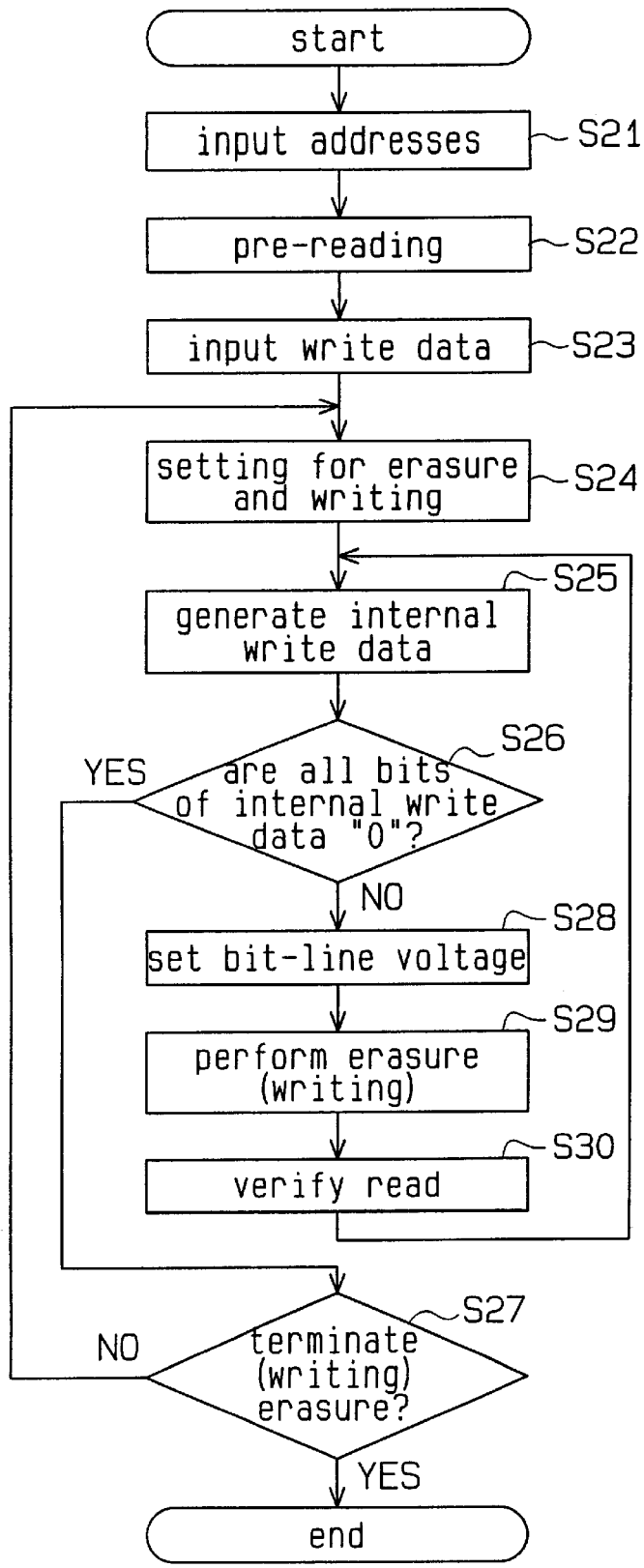

Referring now to FIGS. 24 through 26, a detailed description will be given of the write and bit erase mode according to the sixth embodiment. Because the descriptions of the other operation modes in this embodiment (word line erase mode, read mode and standby mode) are the same as those in the third embodiment, they are not repeated.

In step 21, the row address and column address input to the address pin 125 are latched by the address latch 127. In step 22, pre-reading is performed. Specifically, the row address latched by the address latch 127 is transferred to the row decoder 123, and the column address to the column decoder 124. The row decoder 123 selects one of the word lines WL–WLz (e.g., WLm) in accordance with the row address. The column decoder 124 selects four bit lines from the bit lines BLa–BLz (e.g., BLm–BLp) in accordance with the column address. A voltage indicating 2-bit read data is acquired from each of the memory cells 101 that are connected to the word line WLm and the bit lines BLm––BLp. Therefore, voltages indicating read data of a total of 1 byte is read from four memory cells 101. The individual voltages each indicating 2-bit read data are supplied via the column decoder 124 to the associated sense amplifiers 61 from the associated bit lines BLm–BLp. The sense amplifiers 61 acquires 2-bit read data from the respective voltages and supplies the read data to the read data latch 35. The read data latch 35 latches read data having a total of 1 byte and supplies this data to the data comparator 74.

In step 23, 1-byte write data input to the data pin 128 is latched by the write data latch 32 via the input buffer 129. In step 24, the control core circuit 132 selects the memory cell 101 from which data is to be erased and the memory cell 101 to which data is to be written. First, the following processes in steps 25 to 30 are performed to the memory cell 101 selected for erasure.

In step 25, the data comparator 74 generates internal write data. Specifically, the data comparator 74 receives the write data latched by the write data latch 32 and the read data latched by the read data latch 35, and compares the write data with the read data for each memory cell (i.e., for every two bits), as shown in FIG. 26. Based on the comparison result, the data comparator 74 generates 4-bit internal write data from the four memory cells 101, and supplies the write data to the internal write data latch 72. The internal write data latch 72 then latches the internal write data and supplies this data to the bit-line voltage setting circuit 73.

In step 26, the control core circuit 132 determines if the four bit values of the internal write data are all "0". When those bit values are all "0", the flow advances to step 27 to terminate the erasing operation. When any bit has a value of "1", the flow proceeds to step 28 to execute the erasing operation.

In step 28, the bit-line voltage setting circuit 73 determines the voltages to be applied to the bit lines BLm–BLp which are associated with the individual bits of the internal write data in accordance with the internal write data as shown in FIG. 26.

In step 29, the column decoder 124 controls the individual voltages in such a way that the voltages determined by the bit-line voltage setting circuit 73 are applied to the associated bit lines BLm–BLp. The row decoder 123 applies +15 V to the selected word line WLm and +5 V to the source line SLg associated with the selected word line WLm. As a result, erasure of the individual memory cells 101 associated with the word line WLm and the bit lines BLm–BLp is performed.

In step 30, a read operation for verification after writing is performed. Specifically, after erasure is performed for a given period of time, 1-byte read data is read from the four memory cells 101 which have undergone data erasure and is latched by the read data latch 35 as done in step 22. As a result, the previous read data latched in the read data latch 35 is replaced with the read data that has been newly read. The sequence of processes in steps 25 to 30 is repeated until all the bit values of the internal write data become "0". The repetitive sequence of processes can ensure accurate data erasure even if there is a variation in the characteristics of the individual memory cells 101.

In step 27, the control core circuit 132 determines if the erasure is completed. If the erasure is completed, the flow returns to step 23 and the control core circuit 132 executes the sequence of processes in steps 24 to 30 with respect to the memory cells 101 to which data should be written. During this operation, the row decoder 123 applies +1 V to the selected word line WLm and the voltage of the ground level to the source line SLg associated with the selected word line WLm in step 28. In step 27, the control core circuit 132 determines if data writing is completed, and terminates data writing if it is completed.

Although only six embodiments of the present invention have been described herein, it should be apparent to those skilled in the art that the present invention may be embodied in many other specific forms without departing from the spirit or scope of the invention. Particularly, it should be understood that the invention may be embodied in the following forms.

The number of bits of data which should be erased or written is not limited to one byte. It is however preferable that the number of bits of such data should fall in a range of 1 bit to 1 byte because an increase in the number of the memory cells 101 which are to be erased simultaneously affects power consumption.

In the sixth embodiment, the flash EEPROM may be designed so that data consisting of 3 or more bits is stored in a single memory cell 101.

The sixth embodiment may be combined with any of the second, fourth and fifth embodiments.

This invention may be adapted to a flash EEPROM having a stacked gate memory cells instead of a flash EEPROM having a split gate memory cells. It is to be however noted that the electrostatic capacitance between the drain and the floating gate of a split gate memory cell is greater than that of a stacked gate memory cell. This means that advantageous effects are obtained when the embodiments of the invention are adapted to a split gate type flash EEPROM.

Therefore, the present examples and embodiments are to be considered as illustrative and not restrictive and the invention is not to be limited to the details given herein, but may be modified within the scope and equivalence of the appended claims.

What is claimed is:

1. A non-volatile semiconductor memory device comprising:
   an array of split gate memory cells, each split gate memory cell having a control gate, a source, a drain and a floating gate for storing charges, said floating gate being capacitively coupled to at least one of said source and said drain;
   a plurality of word lines respectively connected to said control gates of said array of split gate memory cells on a per row basis;
   a plurality of bit lines respectively connected to said drains of said array of split gate memory cells on a per column basis; and
   a control circuit for controlling voltages to be respectively applied to said control gates, said sources and said drains to execute erasure of said split gate memory cells in a cell-by-cell manner, wherein in a bit erase mode, said control circuit applies a first predetermined voltage to a bit line connected to said drain of a selected split gate memory cell, and a second predetermined voltage that is different from the first predetermined voltage to bit lines connected to said drains of nonselected split gate memory cells to suppress flow of Fowler-Nordheim tunnel currents between said floating gates and said control gates of the nonselected split gate memory cells.

2. The memory device according to claim 1, wherein said control circuit selectively applies a predetermined third voltage to a selected one of said plurality of word lines.

3. The memory device according to claim 2, wherein said control circuit applies a fourth predetermined voltage that is the same as the second predetermined voltage to said sources of said nonselected memory cells to suppress flow of currents to said sources from said drains of the nonselected memory cells.

4. The memory device according to claim 3, wherein said control circuit simultaneously applies said fourth predetermined voltage to said sources.

5. The memory device according to claim 3, wherein said control circuit separately applies said fourth predetermined voltage to said sources.

6. The memory device according to claim 2, wherein said control circuit sets said sources of said memory cells to a floating state to suppress flow of currents to said sources from said drains of the nonselected memory cells.

7. The memory device according to claim 1, further comprising:
   a detector for detecting a current flowing to said source from said drain of said selected memory cell when said selected memory cell is undergoing erasure; and
   wherein said control circuit determines a time to terminate erasure of said selected memory cell based on a result detected by said detector.

8. The memory device according to claim 1, further comprising:
   a detector for detecting a current flowing to said source from said drain of each memory cell; and
   wherein said control circuit controls individual voltages that are respectively applied to said control gate, said source and said drain based on a result detected by said detector, and such that charges whose quantity corresponds to each value of multi-value data that is stored in each memory cell are stored in said floating gate.

9. The memory device according to claim 1, wherein said control circuit performs erasure of said selected memory cell and simultaneously performs writing of one other memory cell.

10. The memory device according to claim 9, wherein said control circuit applies a fourth predetermined voltage that is the same as the second predetermined voltage to said sources of said memory cells to suppress flow of currents to said sources from said drains of the nonselected memory cells.

11. The memory device according to claim 9, said control circuit sets said sources of said memory cells to a floating state to substantially suppress flow of currents to said sources from said drains of the nonselected memory cells.

12. The memory device according to claim 9, further comprising:
    a detector for detecting a current flowing to said source from said drain of said selected memory cell when said selected memory cell is undergoing erasure; and
    wherein said control circuit determines a time to terminate erasure of said selected memory cell based on a result detected by said detector.

13. The memory device according to claim 9, further comprising:
    a detector for detecting a current flowing to said source from said drain of each memory cell; and
    wherein said control circuit controls individual voltages to be respectively applied to said control gate, said source and said drain based on a result detected by said detector such that charges whose quantity corresponds to each value of a multi-value data that is stored in each memory cell are stored in said floating gate.

14. A non-volatile semiconductor memory device comprising:
    a plurality of word lines;
    a plurality of bit lines;
    an array of split gate memory cells that are selectable by said plurality of word lines and said plurality of bit lines, each split gate memory cell having a control gate connected to an associated one of said plurality of word lines, a drain connected to an associated one of said plurality of bit lines, a source, and a floating gate, said floating gate being capacitively coupled to said drain; and
    a control circuit for controlling voltages that are respectively applied to said word lines, said bit lines and said sources in a memory cell-by-memory cell manner in order to execute erasure of a single, selected split gate memory cell, wherein said control circuit applies a sufficient voltage for inducing a Fowler-Nordheim tunnel current to flow into said floating gate of the selected split gate memory cell.

15. The memory device according to claim 14, wherein said control circuit controls voltages that are applied to said sources of memory cells associated with one of said plurality of word lines to substantially suppress flow of currents to said sources from said drains of said nonselected memory cells.

16. The memory device according to claim 15, wherein said control circuit simultaneously controls said voltages that are applied to said sources.

17. The memory device according to claim 15, wherein said control circuit separately controls said voltages that are applied to said sources.

18. The memory device according to claim 14, wherein said control circuit sets each of said sources of memory cells associated with one of said plurality of word lines to a floating state to substantially suppress flow of currents to said sources from said drains of said nonselected memory cells.

19. The memory device according to claim 14, further comprising:
- a detector for detecting a current flowing to said source from said drain of said selected memory cell when said at least one memory cell is undergoing erasure; and
- wherein said control circuit determines a time to terminate erasure of said selected memory cell based on a result detected by said detector.

20. The memory device according to claim 14, further comprising:
- a detector for detecting a current flowing to said source from said drain of each memory cell; and
- wherein said control circuit controls individual voltages that are respectively applied to each of said word lines, bit lines and said sources based on a result detected by said detector such that charges whose quantity corresponds to each value of multi-value data that is stored in each memory cell are stored in said floating gate.

21. The memory device according to claim 14, wherein said control circuit performs erasure of said selected memory cell and simultaneously performs writing of another at least one selected memory cell; and
- wherein said control circuit applies a sufficient voltage for substantially suppressing the flow of Fowler-Nordheim tunnel currents between said floating gates and said control gates to bit lines connected to said drains of said nonselected memory cells.

22. The memory device according to claim 21, wherein said control circuit controls voltages that are applied to said sources of said memory cells to suppress flow of currents to said sources from said drains of said nonselected memory cells.

23. The memory device according to claim 21, wherein said control circuit sets each of said sources of said memory cells to a floating state to substantially suppress flow of currents to said sources from said drains of said nonselected memory cells.

24. The memory device according to claim 21, further comprising:
- a detector for detecting a current flowing to said source from said drain of said selected memory cell when said selected memory cell is undergoing erasure; and
- wherein said control circuit determines a time to terminate erasure of said selected memory cell based on a result detected by said detector.

25. The memory device according to claim 21, further comprising:
- a detector for detecting a current flowing to said source from said drain of each memory cell; and
- wherein said control circuit controls individual voltages that are respectively applied to each of said word lines, bit lines and said sources based on a result detected by said detector such that charges whose quantity corresponds to each value of multi-value data that is stored in each memory cell are stored in said floating gate.

* * * * *